US006959304B1

(12) United States Patent
Teig et al.

(10) Patent No.: US 6,959,304 B1
(45) Date of Patent: Oct. 25, 2005

(54) METHOD AND APPARATUS FOR REPRESENTING MULTIDIMENSIONAL DATA

(75) Inventors: Steven Teig, Palo Alto, CA (US); Tom Kronmiller, Chapel Hill, NC (US); Andrew F. Siegel, Shoreline, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 80 days.

(21) Appl. No.: 10/288,009

(22) Filed: Nov. 5, 2002

Related U.S. Application Data

(62) Division of application No. 09/526,266, filed on Mar. 15, 2000, now Pat. No. 6,625,611.

(51) Int. Cl.[7] .............................................. G06F 17/30
(52) U.S. Cl. .................................................... 707/102
(58) Field of Search .................. 707/2–10, 100–104.1; 345/645

(56) References Cited

U.S. PATENT DOCUMENTS 5,319,743 A * 6/1994 Dutta et al. ................. 345/645
5,918,232 A * 6/1999 Pouschine et al. ...... 707/103 R
5,937,408 A 8/1999 Shoup et al.
6,073,134 A 6/2000 Shoup et al.
6,108,657 A 8/2000 Shoup et al.
6,226,647 B1 5/2001 Venkatasubramanian et al.
6,460,045 B1 * 10/2002 Aboulnaga et al. ......... 707/102
6,606,621 B2 * 8/2003 Hopeman et al. .............. 707/3
6,760,724 B1 * 7/2004 Chakrabarti et al. ........... 707/4

OTHER PUBLICATIONS

Fontayne & Brown, "The Multiple Storage Radix Hash Tree: An Improved Region Query Data Structure", Digest of Technical Papers, ICCAD-87, pp. 305-305, undated; place of publication unknown.

* cited by examiner

*Primary Examiner*—Diane D. Mizrahi
(74) *Attorney, Agent, or Firm*—Stattler, Johansen, Adeli LLP

(57) ABSTRACT

The invention is directed towards method and apparatus for representing multidimensional data. Some embodiments of the invention provide a two-layered data structure to store multidimensional data tuples that are defined in a multidimensional data space. These embodiments initially divide the multidimensional data space into a number of data regions, and create a data structure to represent this division. For each data region, these embodiments then create a hierarchical data structure to store the data tuples within each region. In some of these embodiments, the multidimensional data tuples are spatial data tuples that represent spatial or geometric objects, such as points, lines, polygons, regions, surfaces, volumes, etc. For instance, some embodiments use the two-layered data structure of the invention to store data relating to geometric objects (such as rectangles) that represent interconnect lines of an IC in an IC design layout.

36 Claims, 23 Drawing Sheets

METHOD AND APPARATUS FOR REPRESENTING MULTIDIMENSIONAL DATA

CLAIM OF BENEFIT TO PRIOR APPLICATIONS

This application is a divisional application of U.S. patent application Ser. No. 09/526,266, filed on Mar. 15, 2000 now U.S. Pat. No. 6,625,611, which is incorporated herein by reference.

BACKGROUND OF THE INVENTION

The present invention is directed towards method and apparatus for representing multidimensional data.

Many applications today analyze multidimensional data records. A multidimensional data record contains a number of data values, which are defined along a number of dimensions (also called attributes or keys) in a multidimensional space. Such records are typically stored in data files or databases.

A spatial data record is one type of multidimensional data record. Spatial data records typically describe the attributes (e.g., the position, size, shape, etc.) of geometric objects, such as points, lines, polygons, regions, surfaces, volumes, etc. Spatial records are used in many fields, including computer-aided design, computer graphics, data management systems, robotics, image processing, geographic information systems, pattern recognition, and computational geometry.

Effective data structures are needed to organize multidimensional and spatial data records efficiently, in order to optimize the time for querying these records. For instance, a sequential list of the multidimensional data records provides the simplest way of storing the records. However, the time needed for performing a query on such a list is intolerably high in most cases since each record in the list needs to be examined for each query.

Numerous multidimensional data structures have been proposed for organizing multidimensional and spatial data records. Hanan Samet, *The Design and Analysis of Spatial Data Structures,* Addison-Wesley Publishing, 1990, includes a review of many of these data structures.

Multidimensional data structures include hierarchical data structures. Hierarchical structures are based on the principle of recursive decomposition of the data space (i.e., the object space or the image space). In other words, these data structures are created by recursively dividing the data space, and storing the data records according to their location in the divided space.

Quadtrees and k-d trees are two types of hierarchical data structures. FIGS. 3–5 illustrate one example of a quadtree, while FIG. 6 illustrates one example of a k-d tree. These examples are described by reference to a use of spatial data records to represent interconnect lines on integrated-circuit layouts. Before describing the examples illustrated in FIGS. 3–6, interconnect lines are first described below.

A. Interconnect Lines

Electronic design automation ("EDA") applications assist engineers in designing integrated circuits ("IC's"). Specifically, these applications provide sets of computer-based tools for creating, editing, and analyzing IC design layouts. These layouts are formed by geometric shapes that represent layers of different materials and devices on IC's. Spatial data records define the spatial attributes of many of these geometric shapes. For instance, spatial data records are used to define geometric shapes that represent conductive interconnect lines. Interconnect lines route signals on the IC's. These lines are sometimes referred to as wire segments or segs.

EDA applications typically characterize interconnect lines as rectangles. FIG. 1 illustrates one such characterization. As shown in this figure, the rectangular line 105 can be represented by different sets of spatial attributes. For instance, the rectangle 105 can be represented by (1) the x- and y-coordinates of any of its opposing corners (such as the corners defined by the minimum and maximum x- and y-coordinates), or (2) the coordinates of one of its corners along with its width and height.

FIG. 2 illustrates a spatial data record 205 that represents the rectangle 105 by its minimum x-coordinate ($X_{MIN}$), the minimum y-coordinate ($Y_{MIN}$), width along the x-coordinate ($\Delta X$), and height along the y-coordinate ($\Delta Y$). The data record 205 also identifies the layer that the interconnect line 105 traverses. This data record further designates the line as a white or gray line. A line is specified as a white line when that line is deemed critical for a particular operation. Alternatively, a line is specified as a gray line when it is not critical for a particular operation. However, a gray line might need to be taken into account for the analysis of a white line.

The six fields of the data record 205 can be viewed as six dimensions. These dimensions define a six-dimensional data space. The data record for each interconnect line can thus be viewed as a data point in the six-dimensional data space.

An interconnect line capacitively couples to other interconnect lines that are within a certain distance of it. This distance is typically the maximum distance of influence between two conductive interconnect lines. This distance is referred to as the halo distance. Capacitive coupling can exist between interconnect lines in the same plane (i.e., intra-layer coupling) or in different planes (i.e., inter-layer coupling).

Calculating such interconnect capacitances has become a critical step in the design of IC's. The decreasing size of processing geometries have increased the concentration and proximity of the interconnect lines, which, in turn, has increased the parasitic effect of interconnect capacitances. Such parasitic capacitances increase signal delay and cause crosstalk, which prevent the IC's from functioning properly.

Hence, in designing an IC, an engineer uses an EDA application to extract and analyze the interconnect capacitances that certain critical interconnect lines experience. An EDA application typically performs two steps to extract the capacitances experienced by a critical interconnect line. First, it identifies all interconnect lines within a certain distance of the critical interconnect line. Second, it calculates the capacitance between the critical interconnect line and each retrieved interconnect line.

To identify quickly the interconnect lines that are near a critical interconnect line, an EDA application needs to use data structures that efficiently organize the data relating to the interconnect line. Two commonly used data structures are quadtrees and k-d trees.

B. Quadtrees

Quadtrees are hierarchical tree data structures with the common property that they recursively decompose the data space into quadrants. One type of quadtree is a region quadtree, which successively subdivides the image space into equal-sized quadrants.

FIGS. 3–5 illustrate one manner for constructing a region quadtree. FIG. 3 presents an IC layout 305 that contains forty interconnect lines. FIG. 4 presents one manner of partitioning the IC layer 305 into equal-sized quadrants along the x- and y-axes. FIG. 5 illustrates the quadtree resulting from this subdivision.

In this example, each interconnect line is characterized as a rectangle that is defined by its minimum x- and y-coordinates and its width and height. The layer information for each rectangle is ignored as the IC layout is divided only along the x- and y-axes. Table 1 lists the four dimension values for each rectangular interconnect line.

TABLE 1

| Object | $X_{MIN}$ | ΔX | $Y_{MIN}$ | ΔY |
|---|---|---|---|---|
| 1 | 140 | 15 | 135 | 12.5 |
| 2 | 145 | 17.5 | 120 | 10 |
| 3 | 120 | 5 | 130 | 20 |
| 4 | 157.5 | 22.5 | 125 | 17.5 |
| 5 | 165 | 10 | 147.5 | 7.5 |
| 6 | 135 | 40 | 160 | 10 |
| 7 | 160 | 10 | 160 | 30 |
| 8 | 190 | 5 | 135 | 15 |
| 9 | 170 | 27.5 | 105 | 20 |
| 10 | 110 | 50 | 107.5 | 7.5 |
| 11 | 70 | 60 | 187.5 | 22.5 |
| 12 | 205 | 10 | 130 | 17.5 |
| 13 | 215 | 20 | 170 | 22.5 |
| 14 | 250 | 25 | 170 | 12.5 |
| 15 | 250 | 50 | 112.5 | 22.5 |
| 16 | 235 | 5 | 135 | 30 |
| 17 | 245 | 10 | 220 | 35 |
| 18 | 230 | 25 | 245 | 10 |
| 19 | 70 | 160 | 275 | 12.5 |
| 20 | 160 | 35 | 225 | 35 |
| 21 | 15 | 10 | 250 | 30 |
| 22 | 20 | 20 | 150 | 30 |
| 23 | 50 | 25 | 157.5 | 12.5 |
| 24 | 40 | 15 | 125 | 20 |
| 25 | 15 | 45 | 100 | 12.5 |
| 26 | 80 | 10 | 122.5 | 17.5 |
| 27 | 30 | 27.5 | 60 | 20 |
| 28 | 80 | 17.5 | 82.5 | 7.5 |
| 29 | 45 | 15 | 20 | 20 |
| 30 | 10 | 50 | 20 | 10 |
| 31 | 110 | 10 | 40 | 10 |
| 32 | 130 | 60 | 70 | 15 |
| 33 | 140 | 50 | 42.5 | 7.5 |
| 34 | 180 | 10 | 30 | 20 |
| 35 | 270 | 5 | 35 | 20 |
| 36 | 217.5 | 37.5 | 75 | 15 |
| 37 | 217.5 | 7.5 | 65 | 25 |
| 38 | 255 | 10 | 50 | 10 |
| 39 | 210 | 35 | 5 | 15 |
| 40 | 75 | 32.5 | 142.5 | 12.5 |

As shown in this FIG. 4, the IC layout 305 is initially partitioned along the x- and y-axes into four equal-sized quadrants. The resulting quadrants are further subdivided into smaller quadrants. The subdivision process continues for all quadrants that would wholly contain at least two interconnect lines and would have at least one non-empty child node. It should be noted that some quadtrees also stop the subdivision process when a quadrant reaches a predetermined threshold size.

FIG. 5 illustrates a quadtree 500 that results from the subdivision that FIG. 4 illustrates. The quadtree 500 contains a root node 505 and a number of non-root nodes. The root node represents the entire IC layout, while the non-root nodes correspond to quadrants that divide the IC layout. Each node has four child nodes if that node's region is subdivided into four quadrants. The nodes that correspond to those quadrants for which no further subdivision is necessary, are leaf nodes (i.e., are nodes with no child nodes).

As shown in FIG. 5, the root node has four child nodes, which are a northwest ("NW") node 510, a northeast ("NE") node 515, a southwest ("SW") node 520, and a southeast ("SE") node 525. These child nodes of the root node correspond to the four quadrants that initially divide the IC layout. Each of these child nodes, in turn, has four child nodes corresponding to the quadrants that subdivide its quadrant. However, at the third level of the tree, only some of the nodes (i.e., nodes 530, 535, 540, and 545) contain child nodes of their own, while at the fourth level of the tree, only one node (i.e., node 550) has child nodes.

As shown in FIG. 5, the quadtree 500 associates the rectangles in the IC layout 305 with both leaf and non-leaf nodes. Specifically, the quadrant associates each rectangle with the node that corresponds to the smallest quadrant that contains the rectangle in its entirety.

To identify all interconnect lines that might capacitively couple to a particular interconnect line, a range query can be performed on the quadtree 500 for all records within a halo region about the particular interconnect line. A range query is a search for all records in a data structure that fall within a particular range-query window.

Once the range-query window is determined, the range-query process starts at the root node and determines whether any rectangles' records associated with that node fall within the range-query window. All records that fall within this query window are returned. The search process continues by traversing the tree, examining the records at each child node whose quadrant the query window intersects, and returning all records that fall within the search window.

One disadvantage of a quadtree is that its search runtime does not linearly increase with the number of records in the data space. Instead, the runtime increases log-linearly with this number. For instance, the run time for performing N range queries for N records in a quadtree is proportional to $N\log_4 N$. So, as the number N of rectangles increases, the run time increases by a factor of $$K\left(1+\frac{\log_4 K}{\log_4 N}\right).$$

Equation (1) below explains this mathematically.

$$\text{Run time increase} = \frac{KN\ \log_4 KN}{N\ \log_4 N} = K\left(1+\frac{\log_4 K}{\log_4 N}\right) \tag{1}$$

Quadtrees also do not work well when the data size is not uniform. This is because the smaller records require smaller quadrants, while the larger records cross quadrant boundaries and therefore need to be stored in the higher level of the quadtree. For instance, in FIG. 5, the root node contains ten rectangles (i.e., segs 1, 2, 5, 6, 10, 16, 19, 32, 33, 40) because these rectangles cross the boundary of the quadrants that initially divide the data space.

The query time suffers when there are a lot of records at the higher-level nodes of the quadtree. This is because, during each query, the search process will have to determine whether the records associated with each node in its traversal path fall within its range-query window. For instance, each time a range query is performed on the quadtree 500 of FIG. 5, the search process needs to examine whether the ten segs at the root node lie within the range query window. Such an examination is wasteful when these ten segs are far away from the range query window, as it would be the case when the range query window is at location 405 around seg 31, as shown in FIG. 4.

Quadtrees also do not perform well when the data distribution is highly non-uniform. In such situations, the quadtree has many more quadrants data records. Quadtrees are also memory intensive because all their levels have to be stored in memory to run queries. Otherwise, the query time might be even slower.

C. K-D Trees

Another class of hierarchical tree data structures are k-d trees. There are several different types of k-d trees but, like quadtrees, all k-d trees are constructed by recursively decomposing the data space. Unlike quadtrees, k-d trees recursively decompose the data space (at each level of the tree) into two regions as opposed to four regions.

Hence, a k-d tree is a binary tree (i.e., a tree where each parent node has at most two child nodes). However, unlike a traditional binary tree that divides the data along one dimension (i.e., along one key), a k-d tree divides the data along k dimensions (i.e., k-keys). In other words, k-d trees use values along k-dimensions to determine branching as opposed to traditional binary trees that use values along one dimension to determine branching (i.e., to select between the left and right subtrees at each level). Thus, a k-d tree is a k-dimensional binary tree.

The search key at each level L of a k-d tree is called the discriminator at that level. Typically, the discriminator changes between each successive level of the tree. One commonly used approach is to define the discriminator at a level L by an L-mod-k operation. Hence, under this approach, the discriminator cycles through the k-dimensions as the tree expands from the root node.

FIG. 6 illustrates a simple k-d tree structure for the rectangles in the layout of FIG. 3. As shown in FIG. 6, the discriminator key cycles through four dimensions as the tree expands from the root node. These four dimensions are: the minimum x-coordinate ($X_{MIN}$), the minimum y-coordinate ($Y_{MIN}$), the width along the x-coordinate ($\Delta X$), and the height along the y-coordinate ($\Delta Y$).

This k-d tree associates one data record with each node in the k-d tree. Each node's discriminator key is then set as the value along that key of the data record stored at that node. For instance, seg 10 is stored at node 630. This node appears on the third level of the tree. Hence, its discriminator is along the $\Delta X$ dimension. The discriminator value is seg 10's $\Delta X$ dimension value, which is 50.

The k-d tree 605 is constructed by inserting the records of the segs in the order that they appear in Table 1. In essence, for each record to be inserted, the tree is traversed based on the record's $X_{MIN}$, $Y_{MIN}$, $\Delta X$, $\Delta Y$ values. At each node, a left branch is taken when the key value of the record is less than the discriminator value at the node, and a right branch is taken when the record's key value is greater than or equal to the discriminator value at the node. When the bottom of the tree is reached (i.e., when a nil pointer is encountered), a node is inserted and the record is inserted into that node.

For instance, as shown in FIG. 6, the first record inserted in k-d tree 605 is seg 1's record, as this record appears first in the Table 1. As the tree contains no other nodes at this point, seg 1's data is inserted in the root node 610 of the tree. At this level of the tree, the discriminator is $X_{MIN}$, and hence the $X_{MIN}$ value of seg 1 is used as the discriminator value at this level.

Seg 2's record is the next record to be inserted into the tree. This record's $X_{MIN}$ value is greater than the $X_{MIN}$ value for seg 1. Thus, seg 2 is added as the right child node 615 of the root node, since its $X_{MIN}$ is greater than the $X_{MIN}$ of the root node. Seg 3's record is then inserted into the tree. This record's $X_{MIN}$ value is less than the $X_{MIN}$ value for seg 1. Hence, seg 3 is added as the left child node of the root node. The child nodes 615 and 620 are both on the second level of the tree, where the discriminator is along the $Y_{MIN}$ dimension. Thus, the discriminator values for nodes 615 and 620 respectively are the $Y_{MIN}$ values of seg 2 and 3.

Seg 4 is the next record to be inserted into the tree. This record's $X_{MIN}$ is greater than that of seg 1's in the root node. Thus, a left branch is taken. Since seg 4's $Y_{MIN}$ is greater than seg 2's $Y_{MIN}$ value, the left pointer of node 615 is examined. Since this pointer is a NIL pointer, a new node 625 is created, seg 4's data is inserted into this node, and the left pointer of node 615 is connected to the new node 625. Since the new node 625 is at the third level of the tree, the discriminator value for the node 625 is seg 4's $\Delta X$ value.

The record insertion process continues in a similar fashion until all the records in Table 1 are inserted in the k-d tree. Under this process, the shape of the resulting k-d tree depends on the order in which the records are inserted into it. Hence, this approach typically results in an unbalanced k-d tree. Numerous techniques have been proposed for constructing balanced k-d trees. Hanan Samet, *The Design and Analysis of Spatial Data Structures,* Addison-Wesley Publishing, 1990, discloses several of these techniques.

K-d trees alleviate many of the deficiencies of quadtrees. For instance, at each node of a k-d tree, only one key needs to be compared to determine which branch to take. K-d trees also function better than quadtrees when the data distribution is highly non-uniform.

On the other hand, like quadtrees, k-d trees are memory intensive because all their levels have to be stored in memory to run queries, in order to minimize their query times. Also, the time for either constructing a k-d tree or querying all its records increases log-linearly with the number of records in the data space as opposed to linearly increasing with this number. In particular, the run time for constructing a k-d tree with N records, or for performing N queries for the N records, is proportional to $N\log_2 N$. So, as the number N of records increases, the construction and query run times increase by a factor of $$K\left(1+\frac{\log_2 K}{\log_2 N}\right).$$

Equation (3) below mathematically explains this increase in runtime.

$$\text{Run time increase} = \frac{KN\ \log_2 KN}{N\ \log_2 N} = K\left(1+\frac{\log_2 K}{\log_2 N}\right) \tag{2}$$

Therefore, there is a need in the art for a data structure that efficiently organizes multidimensional data in memory, so that the time for querying all the data in this data structure only linearly increases with the number of data items. Ideally, this data structure should take a minimal amount of system memory for each query operation.

SUMMARY OF THE INVENTION

The invention is directed towards method and apparatus for representing multidimensional data. Some embodiments of the invention provide a two-layered data structure to store multidimensional data tuples that are defined in a multidimensional data space. These embodiments initially divide the multidimensional data space into a number of data regions, and create a data structure to represent this division. For each data region, these embodiments then create a hierarchical data structure to store the data tuples within each region.

In some of these embodiments, the multidimensional data tuples are spatial data tuples that represent spatial or geometric objects, such as points, lines, polygons, regions, surfaces, volumes, etc. For instance, some embodiments use the two-layered data structure of the invention to store data relating to geometric objects (such as rectangles) that represent interconnect lines of an IC in an IC design layout. In this document, the phrase "spatial object" or "geometric object" does not necessarily refer to an instantiation of a class in an object-oriented program, even though spatial or geometric objects are represented in such a fashion (i.e., are represented as data objects) in some embodiments of the invention.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION OF THE INVENTION

The invention is directed towards method and apparatus for representing multidimensional data. In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a method for organizing multidimensional data tuples. A data tuple is a set of dimension values (also called data values) that collectively represents one entity (e.g., a person, an item, a spatial object, etc.). The dimension values for each data tuple are specified along a number dimensions. These dimensions collectively define a multidimensional data space.

In some embodiments of the invention, each data tuple is formed as a data object (i.e., as an instantiation of a class in an object-oriented program). In other embodiments, however, the data tuples are not represented as data objects.

Figure 7:
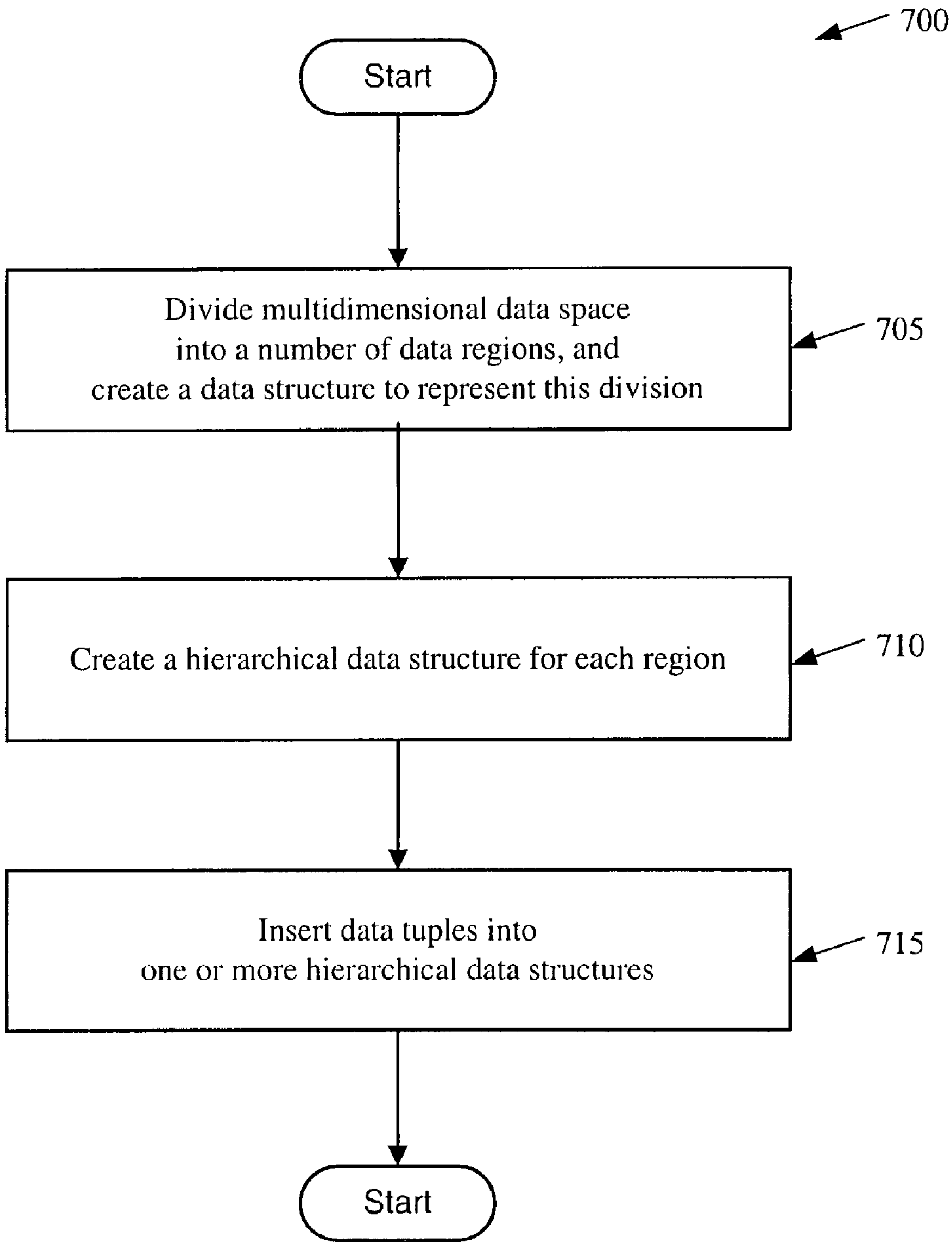
FIG. 7 a process for creating a two-layered data structure to organize multidimensional data tuples.

Some embodiments of the invention create a two-layered data structure to organize the multidimensional data tuples. FIG. 7 illustrates a process 700 used by some of these embodiments. As shown in this figure, the process 700 initially divides (at 705) the multidimensional data space along one or more dimension values. This division results in a number of data regions. The process 700 creates a data structure (e.g., a non-hierarchical data structure) to represent this division. This data structure represents the first data structure layer.

For each data region, the process (at 710) then creates a hierarchical data structure, which represents the second data structure layer. Next, the process (at 715) inserts each data tuple into one or more hierarchical data structures. In particular, the process inserts each data tuple into the hierarchical data structure for the data region that encompasses the data tuple.

Some data tuples cross more than one data region. For some embodiments of the invention, process 700 inserts data tuples into the hierarchical data structures of each data region that they cross. For instance, in some embodiments, the process 700 divides each data tuple that crosses a data region boundary into two tuples along the data region boundary that the data tuple crosses. One of the resulting two tuples falls within one data region, while the other resulting tuple falls within the other data region. The resulting tuples are then inserted into the hierarchical data structures of their corresponding data regions.

For some embodiments of the invention, the process 700 also inserts a data tuple into more then one hierarchical data structure if that data tuple is needed for the analysis of data tuples in more than one hierarchical data structures. For instance, a data tuple might fall outside of a particular data region but might be necessary for the analysis of one or more data tuples within that data region. In the discussion below, the term "non-source" refers to this type of data tuples. Specifically, for a particular data region, a source data tuple is a data tuple that resides in the data region, while a non-source data tuple is a data tuple that is outside of the data region but it is necessary for the analysis of one or more data tuples within the data region.

In some embodiments of the invention, the process 700 insert a copy of some or all of each non-source data tuple for a particular region into that region's hierarchical data structure. This ensures that only one hierarchical data structure is queried for the data tuples of a particular data region.

On the other hand, other embodiments of the invention do not take this approach. These embodiments analyze the non-source data tuples for a particular data region by analyzing the data structures of the data regions that surround the particular data region. Hence, for the data tuples in a particular data region, these embodiments not only query the data structure for that data region but also query the data structures of the surrounding data regions.

The process 700 has numerous advantages. For instance, the time that this process expends on constructing its two-layered data structure increases linearly with the number of data tuples in the data space. The following example illustrates this point. As discussed above, the time for constructing a k-d tree with N data tuples is proportional to $N\log_2 N$. However, if the data space is divided into two data regions and each data region roughly contains N/2 data tuples, the time for constructing a k-d tree for each data region is proportional to $\frac{1}{2}N\log_2(N/2)$. Hence, the time for constructing a k-d tree for both data regions is proportional to $N\log_2(N/2)$, which is better than $N\log_2(N)$.

Similarly, if the data space is divided into R data regions with each data region containing roughly N/R data tuples, the time for constructing k-d trees for all the data regions is proportional to $N\log_2(N/R)$. Equation (3) below explains this mathematically.

$$\text{Total run time} \propto \sum_R \frac{N}{R}\log_2\frac{N}{R} = N\log_2\frac{N}{R} << N\log_2 N \quad (3)$$

Hence, dividing the multidimensional data space into a number of data regions R can reduce the total construction time. This reduction can be significant if the number of data regions R is on the same order as the number of tuples N. In fact, the construction time can be made to increase linearly with the number of data tuples N, by increasing the number of data regions R linearly with the number of data tuples N. For example, if R is selected so that it is always equal to N/1000, then the construction time will always be proportional $N\log_2(1000)$.

I. The Computer System

Figure 8:
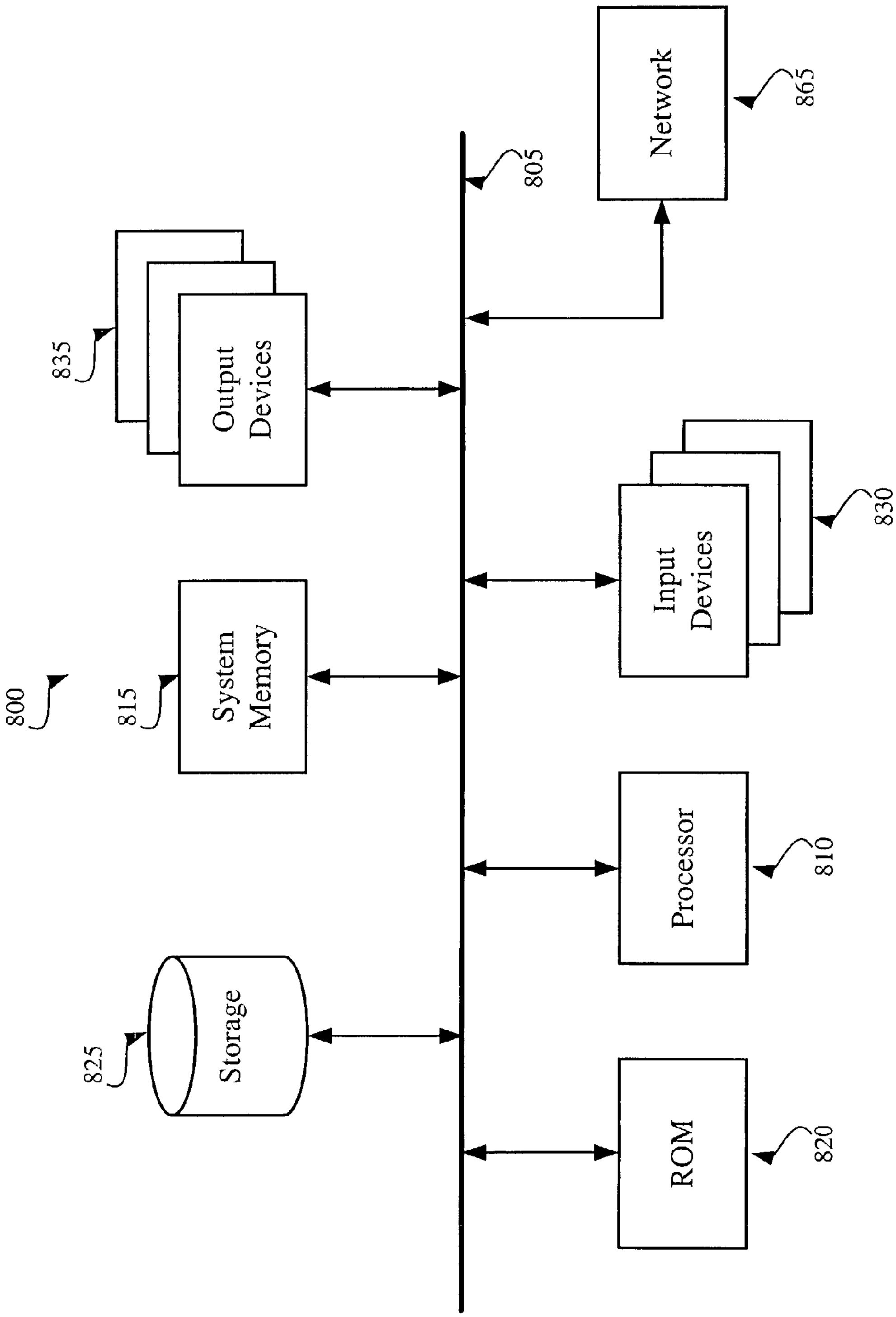
FIG. 8 presents a computer system with which one embodiment of the invention is implemented.

FIG. 8 presents a computer system with which one embodiment of the present invention is implemented. Computer system 800 includes a bus 805, a processor 810, a system memory 815, a read-only memory 820, a permanent storage device 825, input devices 830, and output devices 835.

The bus 805 collectively represents all system, peripheral, and chipset buses that communicatively connect the numerous internal devices of the computer system 800. For instance, the bus 805 communicatively connects the processor 810 with the read-only memory 820, the system memory 815, and the permanent storage device 825. From these various memory units, the processor 810 retrieves instructions to execute and data to process.

The read-only-memory (ROM) 820 stores static data and instructions that are needed by the processor 810 and other modules of the computer system. The permanent storage device 825, on the other hand, is read-and-write memory device. This device is a non-volatile memory unit that stores instruction and data even when the computer system 800 is off. Some embodiments of the invention use a mass-storage device (such as a magnetic or optical disk and its corresponding disk drive) as the permanent storage device 825. Other embodiments use a removable storage device (such as a floppy disk or zip® disk, and its corresponding disk drive) as the permanent storage device. Some embodiments of the invention store the data structures that they create in the permanent storage device 825.

Like the permanent storage device 825, the system memory 815 is a read-and-write memory device. However, unlike storage device 825, the system memory is a volatile read-and-write memory, such as a random access memory. The system memory stores some of the instructions and data that the processor 110 needs at runtime. This system memory can also store the data structures that are created by some embodiments of the invention. For instance, as further described below, some embodiments retrieve a hierarchical data structure from the permanent storage device 825 and store this data structure in the system memory 815 to perform queries on this data structure.

The bus 105 also connects to the input and output devices 830 and 835. The input devices enable the user to communicate information and select commands to the computer system. The input devices 830 include alphanumeric keyboards and cursor-controllers.

The output devices 835 display images generated by the computer system. For instance, these devices display images of spatial objects in some embodiments of the invention. These devices can also be used to display IC design layouts. The output devices include printers and display devices, such as cathode ray tubes (CRT) or liquid crystal displays (LCD).

Finally, as shown in FIG. 8, bus 805 also couples computer 800 to a network 865 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 800 may be used in conjunction with the invention. However, one of ordinary skill in the art would appreciate that any other system configuration may also be used in conjunction with the present invention.

II. Data Structure for Organizing Interconnect-line Data

A wide range of applications can use the invention to create efficient multidimensional data structures. For instance, EDA applications can use the invention's data structures to organize efficiently data relating to interconnect lines on IC's. Such an organization would speed up the identification of nearby interconnect lines and hence speed up the capacitance extraction.

Figure 9:
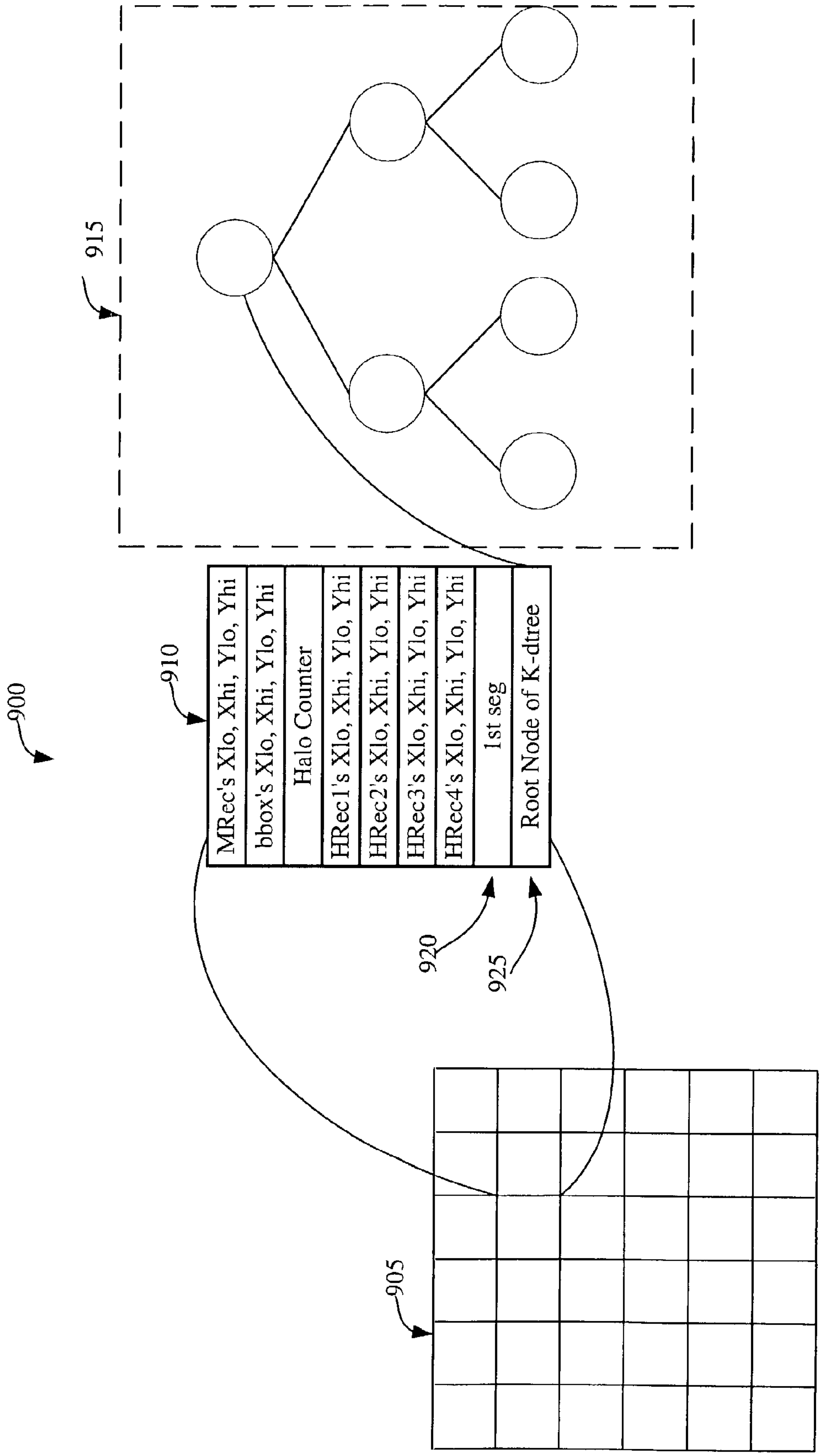
FIG. 9 illustrates one embodiment of the invention that can be used to store data relating to interconnect lines on an IC.

FIG. 9 illustrates one embodiment of the invention that can be used to store data relating to interconnect lines on an IC. As shown in this figure, this embodiment is a two-layer data structure 900. The first layer is a two-dimensional array 905 of tile data structures 910, and the second layer is a k-d tree 915 associated with each tile data structure.

Each tile data structure 915 represents a tile region on the IC layout. As further described below by reference to FIG. 12, some embodiments of the invention use rectangular tiles 1205 that divide the IC layout along x- and y-axes. Dividing the IC layout into tiles along the x- and y-axes divides the IC design space into rectangular buckets that are defined (1) along the x- and y-axes, by their tiles, and (2) along the z-axis, by the thickness of the IC. One of ordinary skill will understand that other embodiments of the invention divide the IC layout space into different shaped regions and along different sets of axes.

As shown in FIG. 9, each tile data structure 910 has an associated k-d tree 915. Each tile's k-d tree efficiently organizes the data relating to the source and non-source interconnect lines for that tile. For a particular tile, a source interconnect line is a line that resides in the tile, while a non-source line is a line that is outside of the tile but it is necessary for the analysis of one or more lines within the tile. The tile data structure 910 will be further discussed in subsection C below.

A. Overall Process for Creating the Data Structure 800

Figure 10:
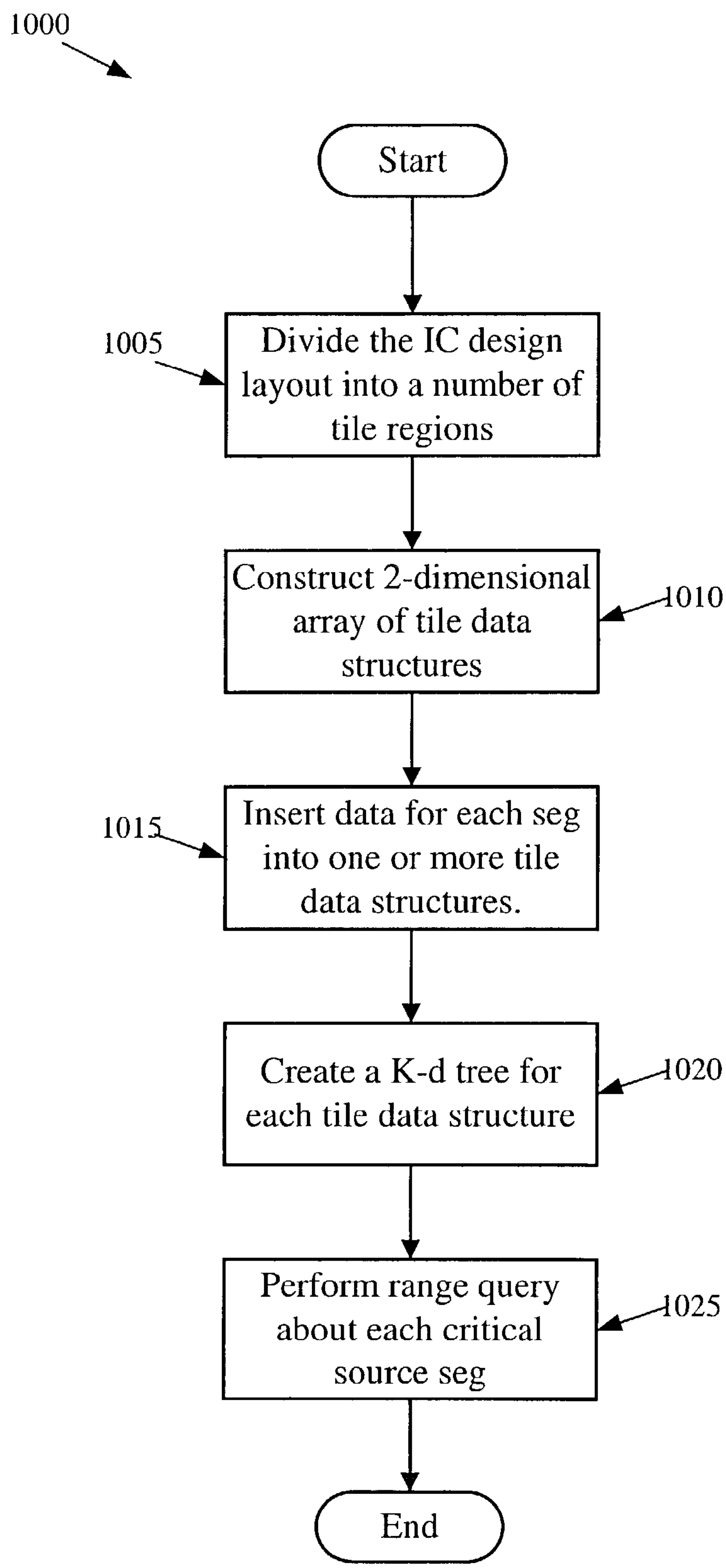
FIG. 10 presents a process that some embodiments of the invention use to create the two-layer data structure of FIG. 9.

FIG. 10 presents a process 1000 that some embodiments of the invention use (1) to create the two-layer data structure 900 of FIG. 9, and (2) to query the data in this structure. As shown in FIG. 10, the process divides (at 1005) the IC layout into a number of tile regions along the x- and y-axes. The process then constructs (at 1010) a two-dimensional array of tile data structures, where each tile data structure represents a tile region. Next, the process inserts (at 1015) the data for each interconnect segment into one or more of the tile data structures. For each tile region, the process creates (at 1020) a k-d tree that stores the interconnect-line data that was inserted into that region's tile data structure. Finally, the process performs (at 1025) a range query about each critical source seg that was entered into the k-d trees. Each of these steps is further discussed below.

B. Dividing the Data Space into a Number of Tile Regions

Figure 11:
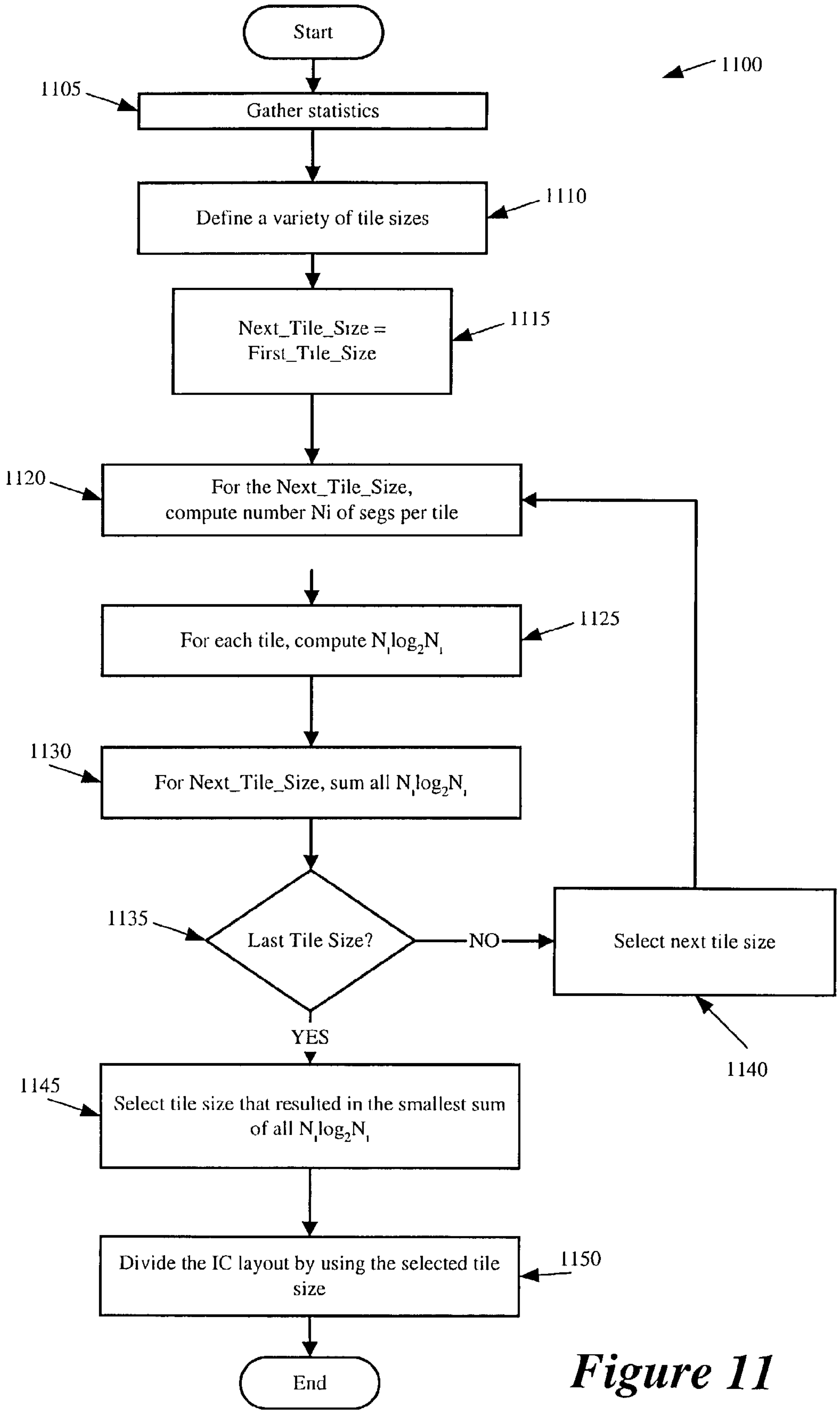
FIG. 11 presents a process for dividing an IC layout into a number of tiles along the x- and y-axes.

FIG. 11 presents a process 1100 for dividing an IC-data space into a number of tiles along the x- and y-axes. Initially, the process gathers (at 1105) statistics about the IC layout. Some embodiments of the invention gather statistics by examining all interconnect lines in the IC's design space. In some embodiments, the statistics that are gathered include the number of interconnect segs, the widths and heights of the segs, and the width and height of the chip.

Some embodiments also determine (at 1105) the maximum halo size. As mentioned before, the halo size is the maximum distance of capacitive influence between two segs. In some embodiments, the halo size can be adaptively calculated by using known prior art techniques. The halo distance can be different for each layer of the IC. Some embodiments use the halo size that is the maximum halo value across all layers.

After gathering statistics, the process then specifies (at 1110) a variety of tile sizes. To do this, some embodiments specify a variety of rows and columns for dividing the IC layout. A given tile size might require the number of rows to differ from the number of columns; such a tile size would be beneficial in situations where the distribution of segs in the horizontal direction is significantly different from the distribution in the vertical direction.

Next, the process selects (at 1115) the first specified tile size for analysis. For this tile size, the process computes (at 1120) the number of segs $N_i$ per tile. As further described below, some embodiments do not actually compute the number of segs $N_i$ per tile but rather statistically determine this number.

The process then computes (at 1125) the time for querying all the records in the k-d tree for that tile (i.e., compute $N_i \log_2 N_i$ for that bin). Next, the process sums (at 1130) the search times for all the tiles to obtain the total search time. Equation (4) mathematically explains the total search time.

$$\text{Total Search time} \propto \sum_{Tiles} N_i \log 2 N_i \tag{4}$$

The process (at 1135) then determines whether it has examined the last tile size. If not, the process (at 1140) selects the next tile size and then repeats the process to compute the total search time for the next tile size. Otherwise, the process (at 1145) identifies the smallest calculated total search time, and selects the tile size that resulted in this search time.

Figure 13:
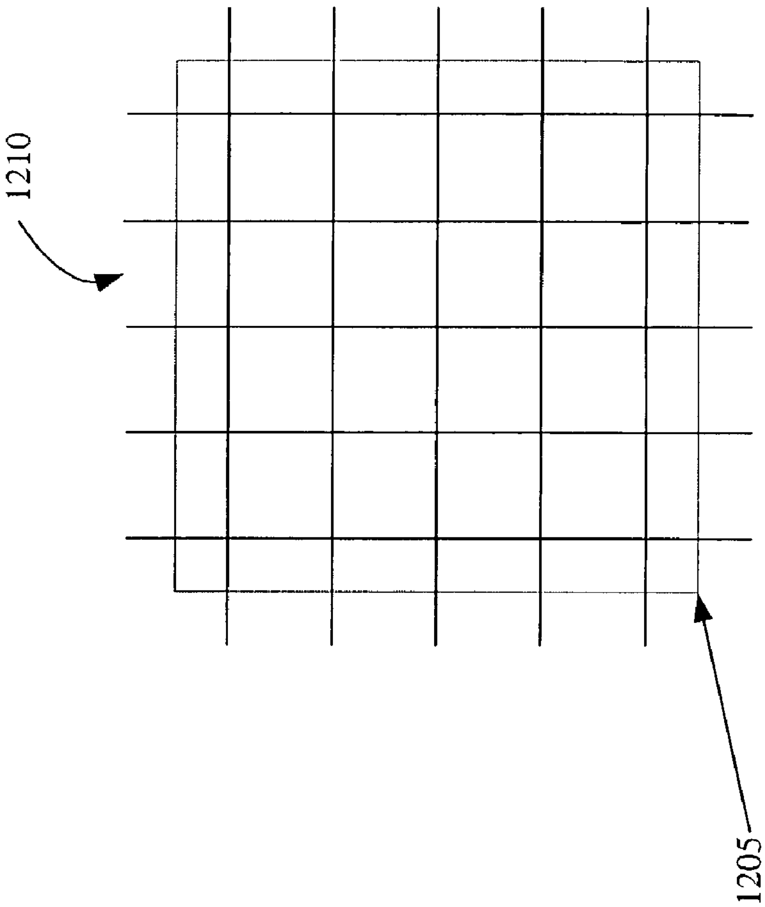
FIG. 13 presents another example of a division of an IC layout by a number of rectangular tiles.
Figure 12:
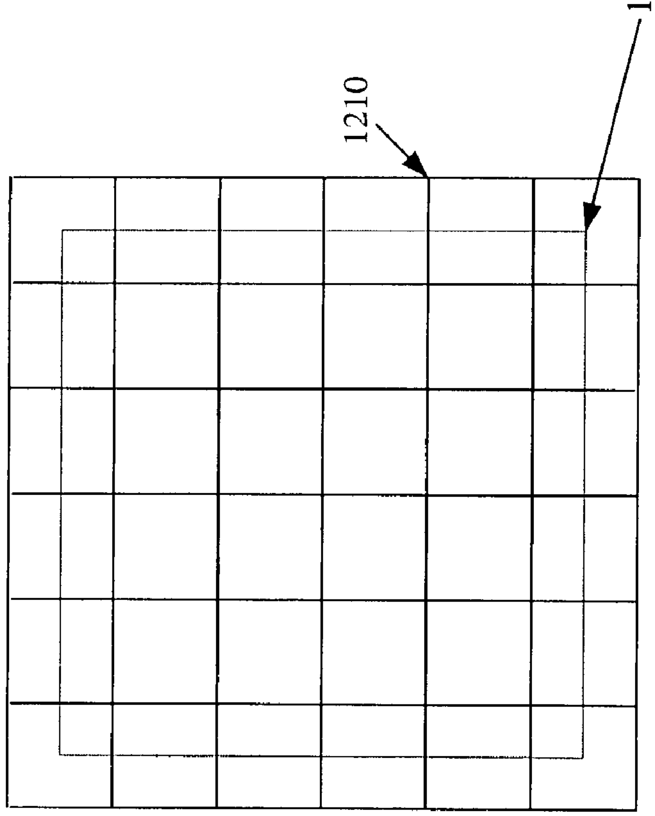
FIG. 12 presents an example of a division of an IC layout by a number of rectangular tiles.

Finally, the process (at 1150) divides the IC layout into a number of tiles based on the selected tile size. FIG. 12 presents an example of a division of an IC layout 1205 by a number of rectangular tiles 1210. In some embodiments of the invention, the exterior tiles (i.e., the tiles that cover the exterior sides of the IC layout) are extended to infinity, in order to protect against numerical round-off errors. FIG. 13 presents an example of such an approach.

Some embodiments of the invention do not actually compute (at 1120) the number of segs $N_i$ per tile, but instead predict the average number of segs $\mu$ per tile. Some of these embodiments use the following equation (5) to compute the estimated number of segs $\mu$.

$$\mu = \frac{n_S[a_S + w_S(2d + h_B) + h_S(2d + w_B) + (2d + h_B)(2d + w_B)]}{wh} \tag{5}$$

In this equation, $n_s$ is the total number of the segments, $a_s$ is the mean area of the segments, $w_s$ is the mean width of the segments, $h_s$ is the mean height of the segments, $w_B$ is the width of each tile, $h_B$ is the height of each tile, w is the total width of the IC, and h is the total height of the IC.

Figure 14:
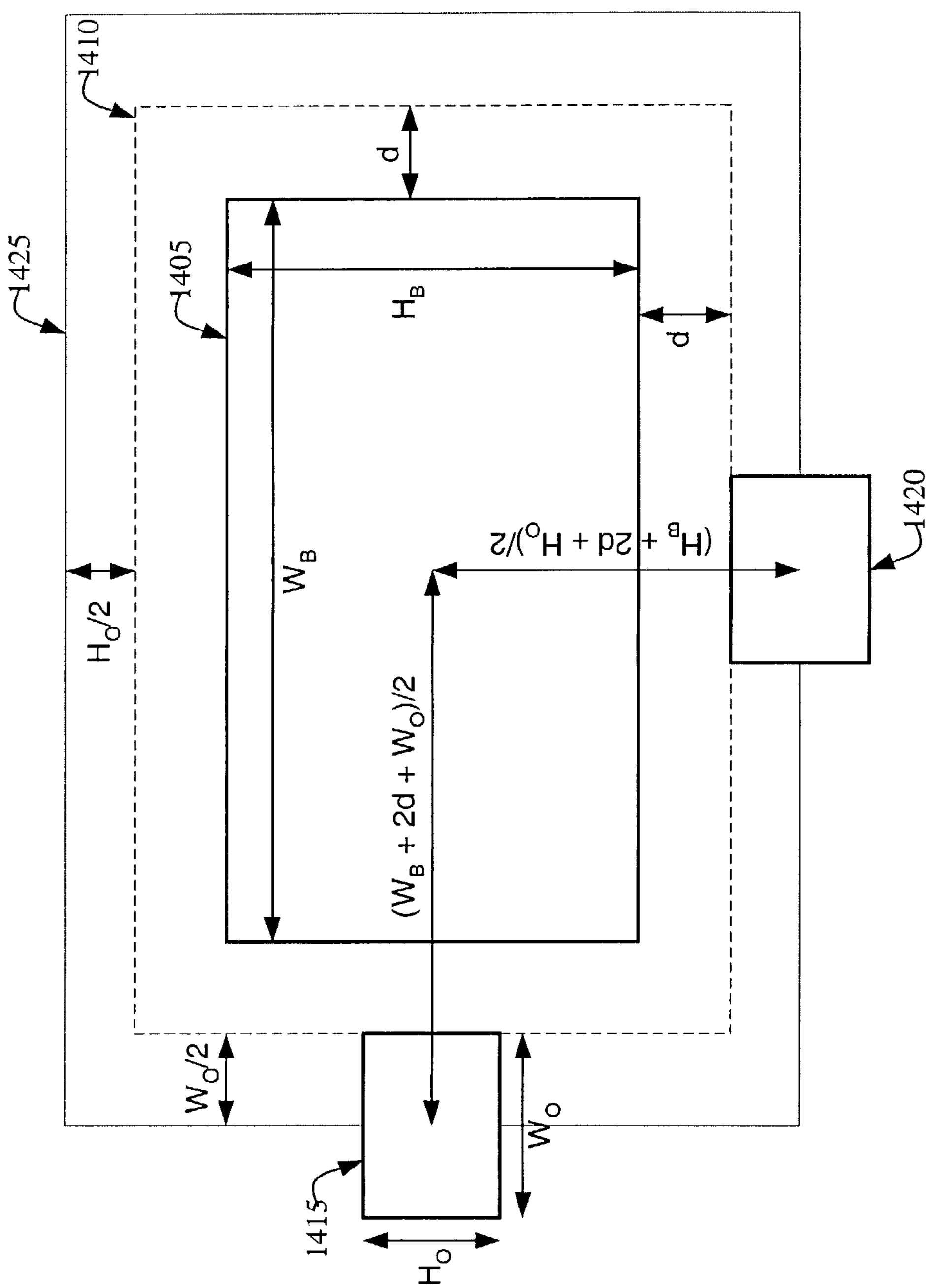
FIG. 14 illustrates a tile, its halo boundary, and two segments abutting the outer periphery of the tile's halo boundary.

Equation (5) is based on the assumption that the position of each segment in the IC layout is random. FIG. 14 illustrates how this equation was derived. This figure illustrates a particular tile 1405, the tile's halo boundary 1410, and two segments 1415 and 1420. The file 1405 has a width of $w_B$ and a height of $h_B$, while the tile's halo boundary has a width of $w_B$+2d and a height of $h_B$+2d. The two segments both have a width $w_0$ and height $h_0$.

As further discussed below by reference to FIGS. 18–21, an interconnect segment must fall within the tile 1405 or its halo boundary 1410 for it to be inserted into the tile's k-d tree. As shown in FIG. 14, the segments 1415 and 1420 fall just outside of the halo boundary 1410 of the tile. This is because the center of segment 1415 is a distance $(w_0+2d+w_B)/2$ away from the center of the tile, while the center of segment 1420 is a distance $(h_0+2d+h_B)/2$ away from the center of the tile.

Hence, in order for a segment with a width $w_0$ and height $h_0$ to fall within the halo boundary 1310 of the tile, the center of this segment must fall within a rectangle 1425 centered at the tile and having width $w_0+2d+w_B$ and height $h_0+2d+h_B$. Because the position of each segment in the IC layout is random, the probability P that such a segment overlaps the tile is equal to the area of rectangle 1425 divided by the area of the IC. Equation (6) illustrates this probability.

$$P = \frac{(w_0 + 2d + w_B)(h_0 + 2d + h_B)}{wh} \tag{6}$$

Equation (7) below is obtained by expanding the formula for the probability that a given segment overlaps a given tile.

$$P = \frac{[w_O h_O + w_O(2d + h_B) + h_O(2d + w_B) + (2d + h_B)(2d + w_B)]}{wh} \tag{7}$$

Now, the average number of segs per tile can be obtained by using equation (7) to calculate the probability for all the segments and summing the calculated probabilities. Equation (8) explains this operation mathematically.

$$\mu = \sum_{n_S} P_1 = \sum_{n_S} \frac{[w_O h_O + w_O(2d + h_B) + h_O(2d + w_B) + (2d + h_B)(2d + w_B)]}{wh} \tag{8}$$

The sum of $w_0h_0$ becomes $n_s a_s$, while the sum of $w_0$ becomes $n_s w_s$, and the sum of $h_0$ becomes $n_s h_s$. Hence, equation (8) can be simplified into equation (9) below:

$$\mu = \sum_{n_S} P_1 = \frac{[n_S a_S + n_S w_S(2d + h_B) + n_S h_S(2d + w_B) + n_S(2d + h_B)(2d + w_B)]}{wh} \tag{9}$$

By factoring out the variable $n_s$, Equation (5) is derived from Equation (9). As set out in equation (10) below, the formula for $\mu$ may also be given in terms of the total area $A_s$ of the segments, the total width $W_s$ of the segments and the total height $H_s$ of the segments as follows:

$$\mu = \frac{[A_S + W_S(2d + h_B) + H_S(2d + w_B) + n_S(2d + h_B)(2d + w_B)]}{wh} \tag{10}$$

As further described below by reference to FIGS. 18–21, in some embodiments, a seg might result in multiple data-tuple entries into the k-d tree of a particular tile. Whether a seg requires multiple data-tuple entries depends on (1) the number of tile boundaries that the seg crosses, (2) the manner that the data structure treats segs that are close to or cross tile boundaries, and (3) the particular implementation of the halo boundary surrounding the tile.

Equations (5) and (10), however, do not account for the multiple data-tuple entries into the k-d tree for such segs. These equations assume that such multiple entries minimally affect the average number of segs per tile. These equations, however, can be modified by adding a constant multiplier (e.g., such as a multiplier of 1.1 or 1.2) to account for the increase in the number of segs per tile due to the segs that cross halo and tile boundaries. This multiplier can be larger for the smaller tile sizes because smaller tiles result in more seg crossings.

C. Constructing a Two-Dimensional Array of Tile Data Structures

As shown in FIG. 10, the process 1000 constructs a two-dimensional array of tile data structures after the IC layout is divided into a number of tile regions along the x- and y-axes. Each particular tile data structure represents a particular tile region. In some embodiments of the invention, each tile data structure is a tile data object (i.e., an instantiation of a tile data class). Moreover, some embodiments construct the array as a two-dimensional array of tile data objects. In these embodiments, two index values identify the location of each tile data object in the two-dimensional array. Other embodiments, however, construct this array as an array of pointers, where each pointer points to a particular data object. In these embodiments, the two index values identify the location of a pointer, which points to the tile data object.

FIG. 9 illustrates the tile data structure 910 that is used in some embodiments of the invention. This tile data structure 910 represents a tile by specifying one main rectangle ("MRec"), zero to four halo rectangles ("HRec"), and one bounding box ("bbox") rectangle.

Figure 15:
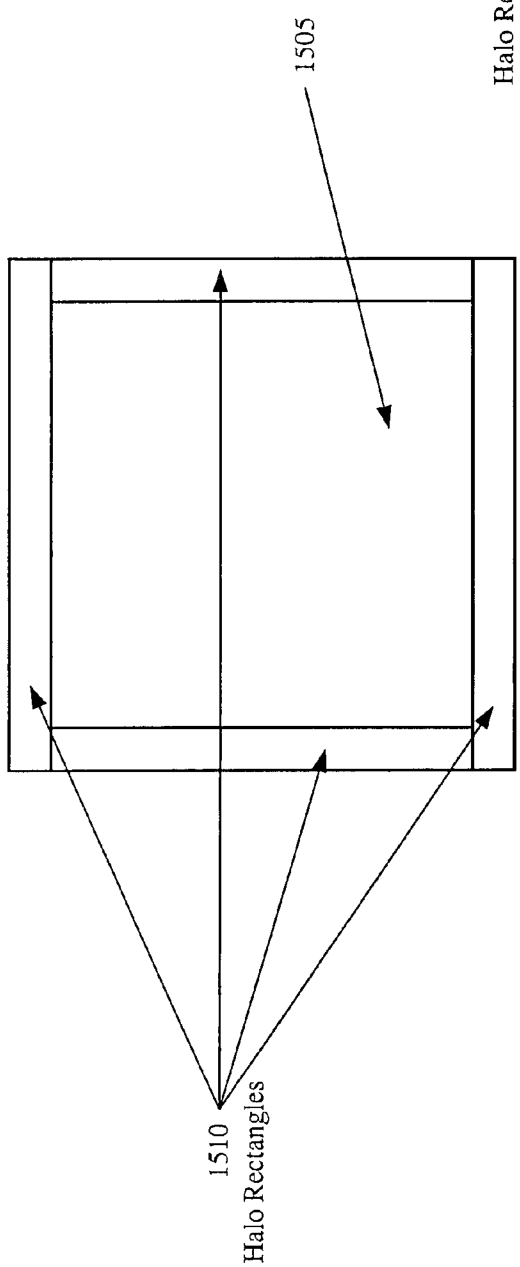
FIGS. 15–17 illustrate the main and halo rectangles of several rectangular tiles.
Figure 16:
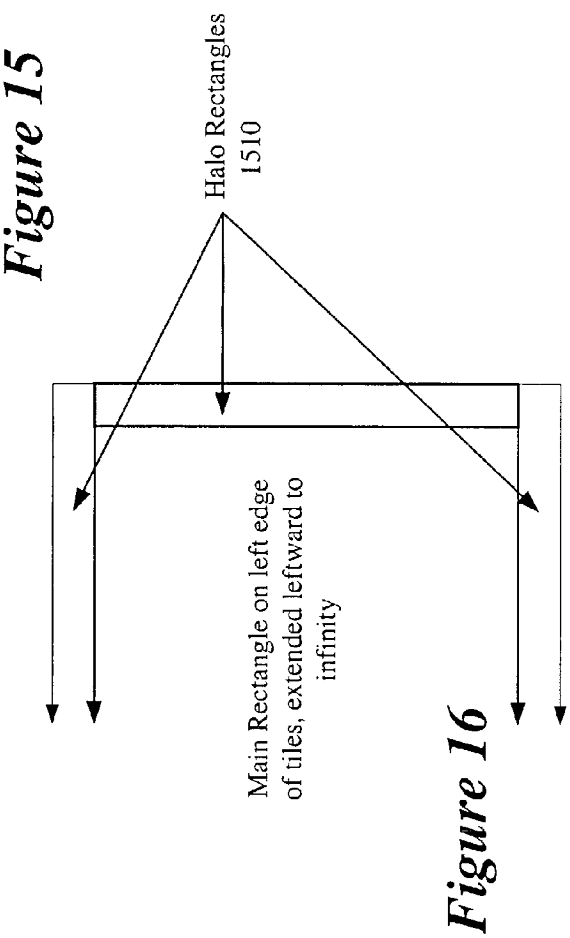
Figure 17:
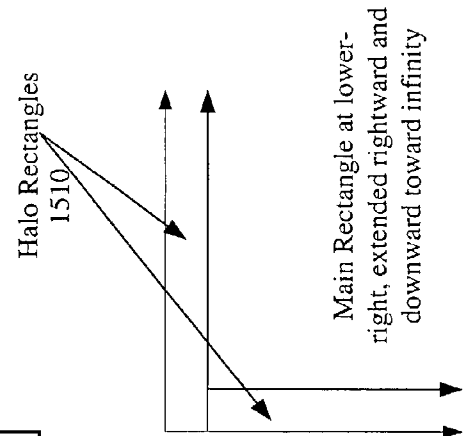

As shown in FIGS. 15–17, the main rectangle 1505 is the tile rectangle that is specified by the tile-defining process of FIG. 11, while the halo rectangles 1510 correspond to halo regions that surround the tile. The halo regions are used to identify non-source interconnect lines. As described above, non-source interconnect lines are lines that fall outside of a tile (or main) rectangle 1505. Non-source interconnect lines are necessary for the analysis of interconnect lines within the tile.

In other words, when extracting capacitances felt by a particular source interconnect line that is close to its tile's edge, it might be necessary to look for non-source interconnect lines outside of the tile, because such interconnect lines might be within the halo distance of the particular interconnect line. The halo regions provide one solution for identifying non-source interconnect lines. As described below by reference to FIGS. 18–21, some embodiments of the invention insert into the tile's hierarchical data structure a copy of the non-source interconnect lines that fall within the halo rectangle 1510 of the tile.

In some embodiments of the invention, a typical tile has four halo rectangles, as shown in FIG. 15. However, the tiles at the periphery of the chip have fewer halo rectangles. For example, as shown in FIG. 16, a tile in the middle of the left edge of the IC layout only has three halo rectangles, two of which extend to infinity in the embodiments that extend the outer tiles to infinity. Also, as shown in FIG. 17, a tile in the lower-right corner of the IC layout only has two halo rectangles, both of which extend to infinity in the embodiments that extend the outer tiles to infinity. In the extreme case of a chip containing only two tiles, each would have a single halo rectangle. In addition, there would be no halo rectangles in the extreme case of a chip containing only a single tile.

The bounding box rectangle encloses the tile's main and halo rectangles. As described further below, the bounding box rectangle is used to quickly identify all the interconnect lines that intersect the tile's main and halo rectangles. These identified interconnect lines can then be inserted as source or non-source interconnect lines in the hierarchical data structure of the tile.

As shown in FIG. 9, the tile data structure represents the main, halo, and bounding-box rectangles by their minimum x ($X_{MIN}$), minimum y ($Y_{MIN}$), maximum x ($X_{MAX}$), and maximum y ($Y_{MAX}$) coordinates. The data structure also included a counter for specifying the number of halo rectangles the tile has (i.e., the number of valid halo rectangles in the tile data structure). The data structure further includes a pointer 920 to the first seg inserted into the data structure. Finally the data structure includes a pointer 925 to the root node of the tile's k-d tree.

D. Inserting Segs in the Tile Data Structures

As shown in FIG. 10, the process 1000 inserts (at 1015) each interconnect segment into one or more of the tile data structures after it constructs a two-dimensional array of tile data structures. To insert an interconnect segment into a tile data structure, the process must first determine whether the interconnect segment crosses the boundaries of the main or halo rectangles of the tile structure. If so, the process must break the interconnect segment into one or more pieces along the boundaries that it crosses. The resulting pieces are discarded if they are outside the tile's bounding box, or inserted in the tile data structure as a source or non-source seg if they fall within the tile's boundary box.

Figure 18:
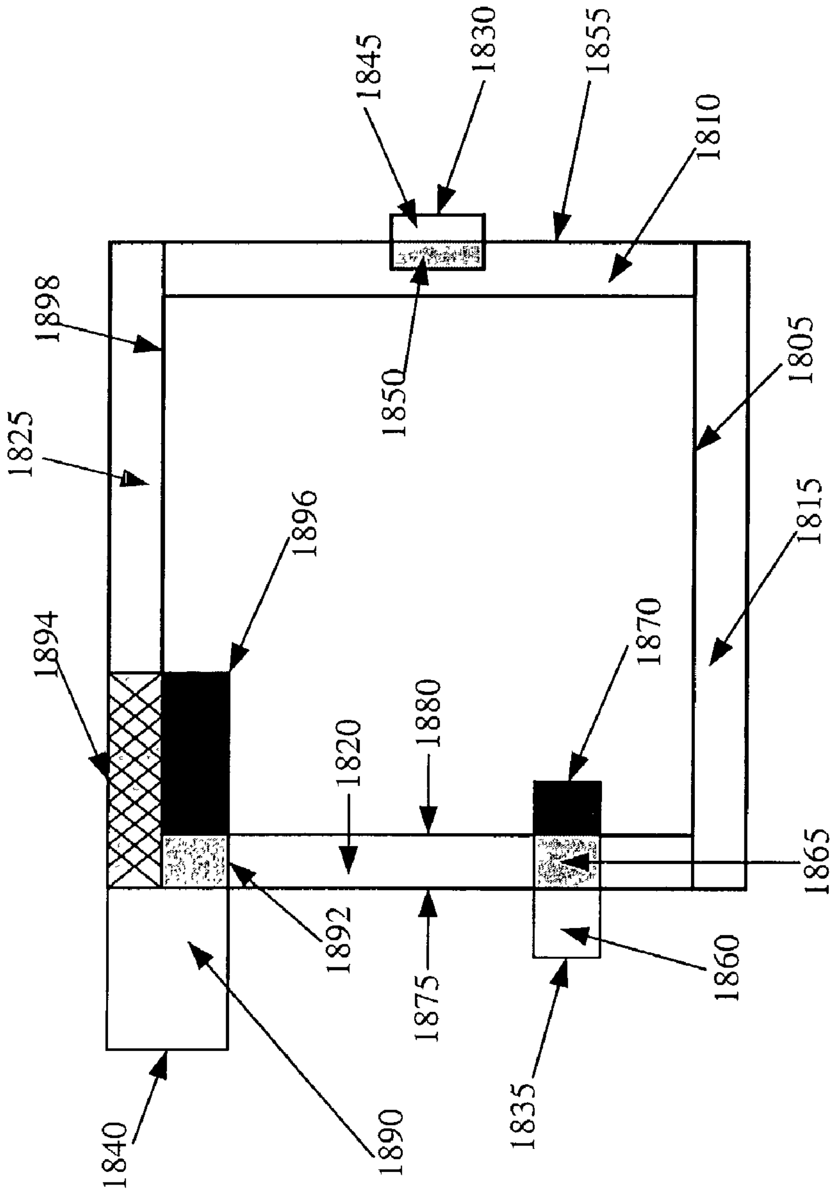
FIG. 18 pictorially illustrates the breaking up of three segments along the boundaries of the main and halo rectangles of a tile.

FIG. 18 pictorially illustrates the breaking up or three segs along the boundaries of a tile 1805. This tile has four halo rectangles 1810, 1815, 1820, and 1825 that surround it, and three segs 1830, 1835, and 1840 that fall within the tile's halo rectangle and/or main rectangle.

As shown in FIG. 18, seg 1830 intersects the halo rectangle 1810. This seg 1830, however, does not intersect the main tile rectangle 1805. Hence, this seg is only divided into two parts 1845 and 1850 along the boundary 1855 of the halo rectangle 1810. Part 1845 is discarded as it falls outside the tile's bounding box, while part 1850 is selected as a non-source seg to insert into the tile's data structure.

Another seg illustrated in FIG. 18 is seg 1835. This seg intersects the main rectangle 1805 and the halo rectangle 1820 of the tile. Hence, this seg is divided into three parts 1860, 1865, and 1870 along the boundaries 1875 and 1880 of the halo and main rectangles. Part 1860 is discarded as it falls outside the tile's bounding box, part 1865 is selected as a non-source seg to insert into the tile's data structure, and part 1870 is selected as a source seg to insert into the tile's data structure.

The final seg illustrated in FIG. 18 is seg 1840. This seg intersects the main rectangle 1805 and the halo rectangle 1820 and 1825 of the tile. Hence, this seg is divided into four parts 1890, 1892, 1894, and 1896 along the boundaries 1875, 1880, and 1898 of the main and halo rectangles 1805, 1820, and 1825. Part 1890 is discarded as it falls outside the tile's bounding box. Parts 1892 and 1894 are identified as non-source segs and inserted into the tile's data structure. Part 1896 is selected as a source seg to insert into the tile's data structure.

Figure 19:
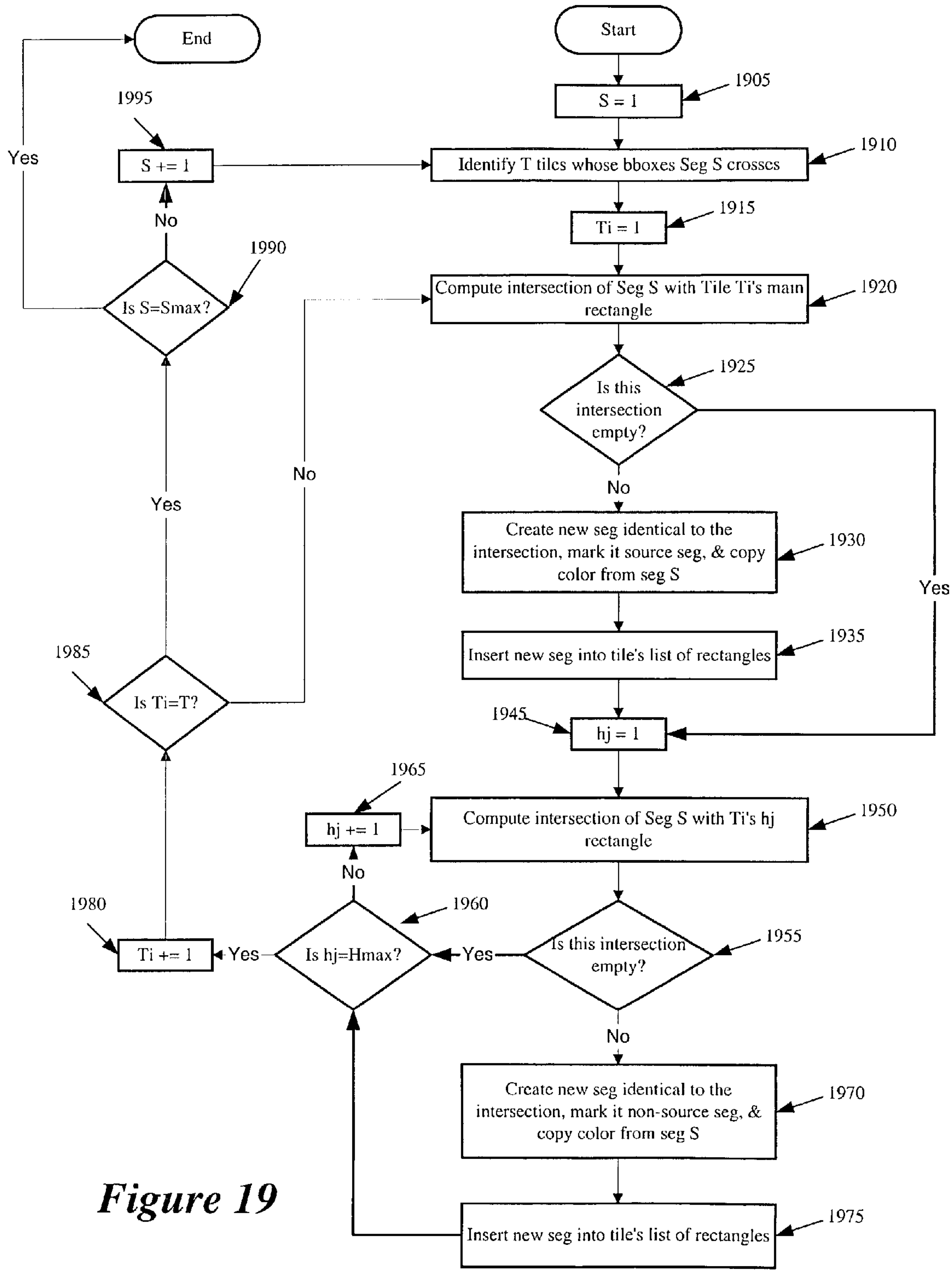
FIG. 19 presents a process for inserting interconnect segments into one or more tile data structures.

FIG. 19 presents a process 1900 for inserting interconnect segments into one or more tile data structures. As shown in this figure, the process (at 1905) initially sets a segment number S equal to 1. Next, the process (at 1910) identifies all tiles that segment S intersects. The process identifies these tiles by using the minimum and maximum coordinates of the segment S to calculate a range of indices into the tile data array 905.

It calculates the minimum x-index by (1) subtracting the halo size from the minimum x-coordinate of the segment S, (2) dividing the subtraction result by the width of the tiles, and (3) rounding down to the next integer the division result. The process calculates the minimum y-index by (1) subtracting the halo size from the minimum y-coordinate of the segment S, (2) dividing the subtraction result by the height of the tiles, and (3) rounding down to the next integer the division result.

The process calculates the maximum x-index by (1) adding the halo size from the maximum x-coordinate of the segment S, (2) dividing the addition result by the width of the tiles, and (3) rounding up to the next integer the division result. The process calculates the maximum y-index by (1) adding the halo size from the maximum y-coordinate of the segment S, (2) dividing the addition result by the height of the tiles, and (3) rounding up to the next integer the division result. Based on these calculated indices, the process retrieves one or more tile data structures from the two-dimensional array 905.

After identifying the tiles that the segment intersects, the process (at 1915) sets the tile count $T_i$ equal to 1. The process (at 1920) then computes the intersection of the segment S with the main rectangle of the tile $T_i$. Some embodiments of the invention use existing algorithms to compute the intersection of two rectangles. For instance, some embodiments examine the sorted list of coordinates for the two rectangles, to identify the minimum x- and y-values of the maximum x- and y-coordinates ($X_{MAX}$ and $Y_{MAX}$) of the rectangles, and the maximum x- and y-value of the minimum x- and y-coordinates ($X_{MIN}$ and $Y_{MIN}$) of the rectangles. If the identified minima and maxima are still sorted (e.g., if the maximum x-coordinate is still greater than the minimum x-coordinate, and the maximum y-coordinate is still greater than the minimum y-coordinate) then the two rectangles intersect and the identified minima and maxima specify the corners of the rectangle created at their intersection. If the identified minima and maxima are not sorted any longer, then the two rectangles do not intersect.

Figure 20:
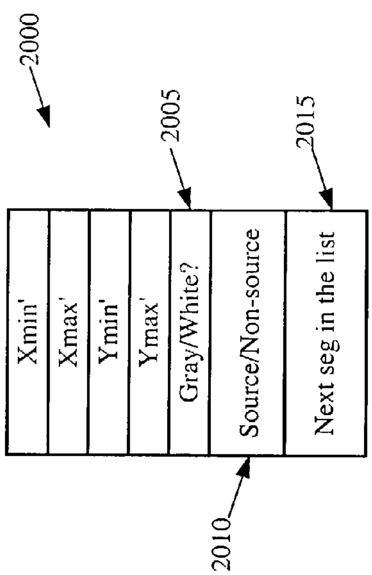
FIG. 20 illustrates a rectangle data structure for insertion in a tile data structure.

Next, the process (at 1925) determines whether this intersection is empty. If so, the process transitions to step 1945. If not, the process (at 1930) creates a new rectangle identical to the rectangle defined by the intersection of the segment S with the main rectangle of the tile $T_i$. To specify this new rectangle, the process creates new rectangle data structure 2000, which is illustrated in FIG. 20. This data structure defines the new rectangle by its minimum x ($X'_{MIN}$), minimum y ($Y'_{MIN}$), maximum x ($X'_{MAX}$), and maximum y ($Y'_{MAX}$) coordinates.

This data structure also includes a field 2010 that specifies whether the rectangle is a source or non-source rectangle. The process (at 1930) marks the new rectangle as a source rectangle since it is in the main rectangle of the tile. The data structure 2000 further includes a field 2005 that specifies whether the rectangle is white or gray (i.e., critical or not), and the process (at 1930) specifies the new rectangle as a white or gray depending on the corresponding attribute of the segment S. The data structure 2000 also includes a pointer 2015 that is for linking the new rectangle to another rectangle in a list.

Figure 21:
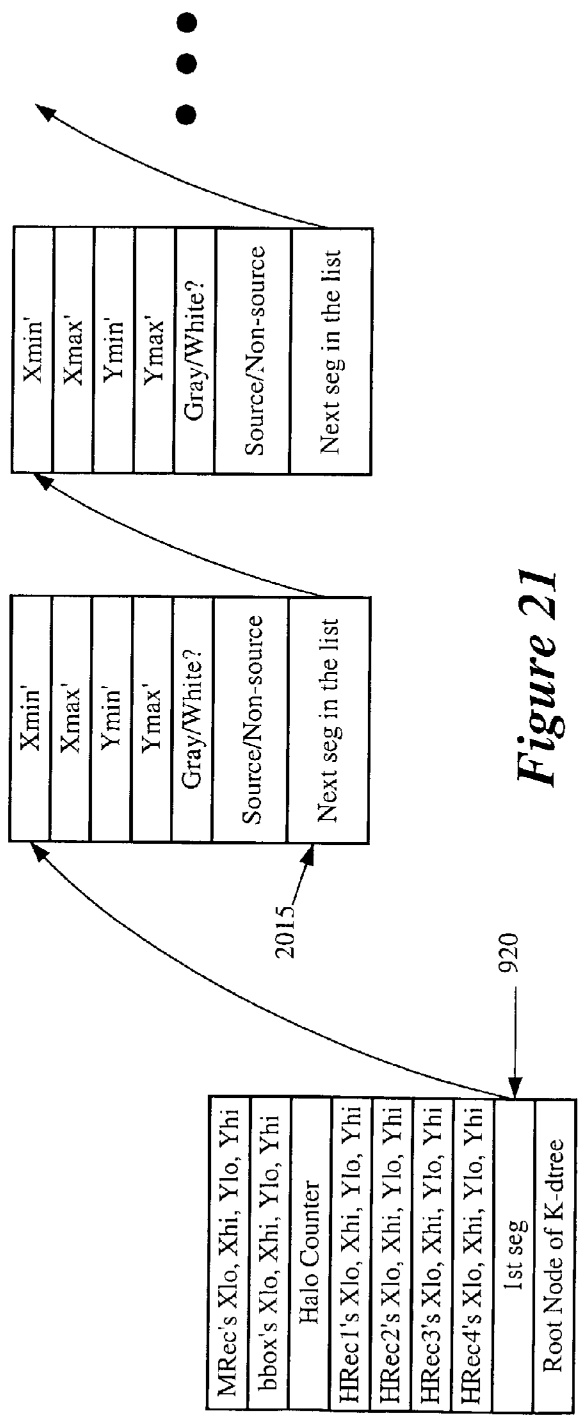
FIG. 21 illustrates a tile data structure with inserted rectangle data structures.

Next, the process (at 1935) inserts the new rectangle in the data structure for tile $T_i$. As shown in FIG. 21, the new rectangle is inserted by linking the pointer 920 of the tile data structure 910 to the new rectangle, if the new rectangle is the first rectangle inserted into the tile data structure.

Otherwise, the new rectangle is inserted by linking the pointer 2015 of the last-inserted rectangle to the new rectangle.

After inserting the new rectangle, the process (at 1945) sets the halo-rectangle number $H_j$ to 1. The process (at 1950) then computes the intersection of the segment S with the halo rectangle $H_j$ of the tile $T_i$. Next, the process (at 1955) determines whether this intersection is empty. If so, the process transitions to step 1960.

If not, the process (at 1970) creates a new rectangle identical to the rectangle defined by the intersection of the segment S with the halo rectangle $H_j$ of the tile $T_i$. The data structure of this new rectangle is identical to that shown in FIG. 20. Hence, the process creates the new rectangle by specifying its minimum x ($X_{MIN}$), minimum y ($Y_{MIN}$), maximum x ($X_{MAX}$), and maximum y ($Y_{MAX}$) coordinates. The process also specifies the new rectangle as a non-source rectangle since it is in the halo region of the tile. The process further specifies the new rectangle as a white or gray (i.e., critical or non-critical) rectangle depending on the corresponding attribute of the segment S.

Next, the process (at 1975) inserts the new rectangle in the data structure for tile $T_i$. As before, if another rectangle has already been inserted in this tile data structure, the new rectangle is inserted by linking the pointer 2015 of the last-inserted rectangle to the new rectangle. Otherwise, the new rectangle is inserted by linking the pointer 920 of the tile data structure 910 to the new rectangle.

The process (at 1960) determines whether the halo rectangle number $H_j$ equals the halo counter value of the segment S. If not, the process (at 1965) increments the halo rectangle number $H_j$ by 1 and then transitions back to step 1950 for the next halo region of tile $T_i$. Otherwise, the process (at 1980) increments the tile number $T_i$ by 1, and then determines (at 1985) whether all the identified tiles were examined. If not, the process transitions to step 1920 to repeat the process for the next intersected tile.

On the other hand, if all the identified tiles were examined, the process determines (at 1990) whether all the segments have been examined. If so, the process ends. Otherwise, the process (at 1995) increments the segment number S, and then identifies (at 1910) all tiles that the new segment S intersects. The process is then repeated for the new segment S.

E. Create a K-D Tree for Each Tile

As shown in FIG. 10, the process 1000 creates (at 1020) a k-d tree for each tile region after it inserts the interconnect segments into the tile data structures. Each k-d tree efficiently organizes the data relating to the interconnect segments in its tile. Some embodiments of the invention use a two-step process to create a k-d tree for a tile. First, they convert each inserted seg into a k-d node. Second, they connect the k-d nodes to build a k-d tree.

Figure 22:
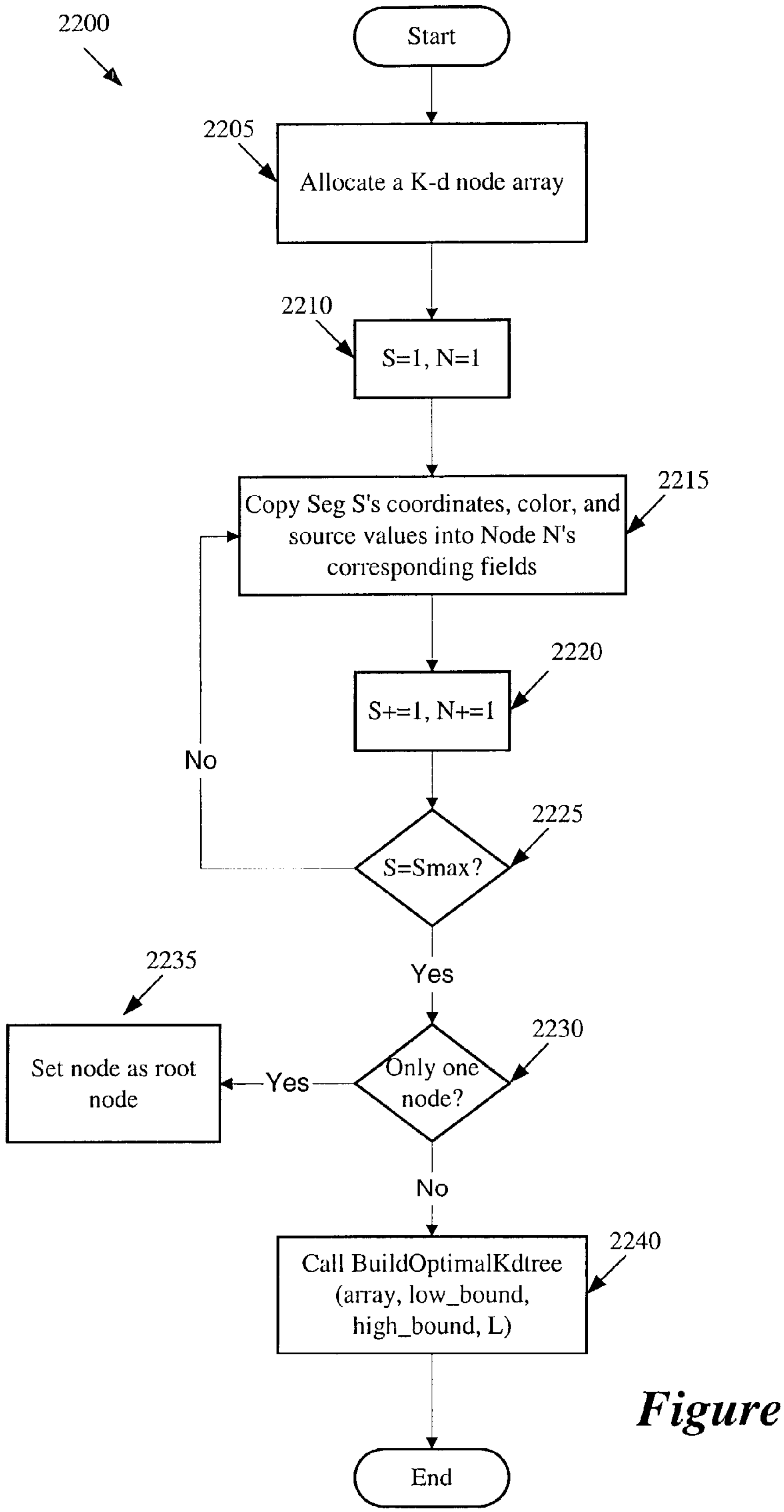
FIG. 22 illustrates a process for converting inserted rectangles into nodes.
Figure 23:
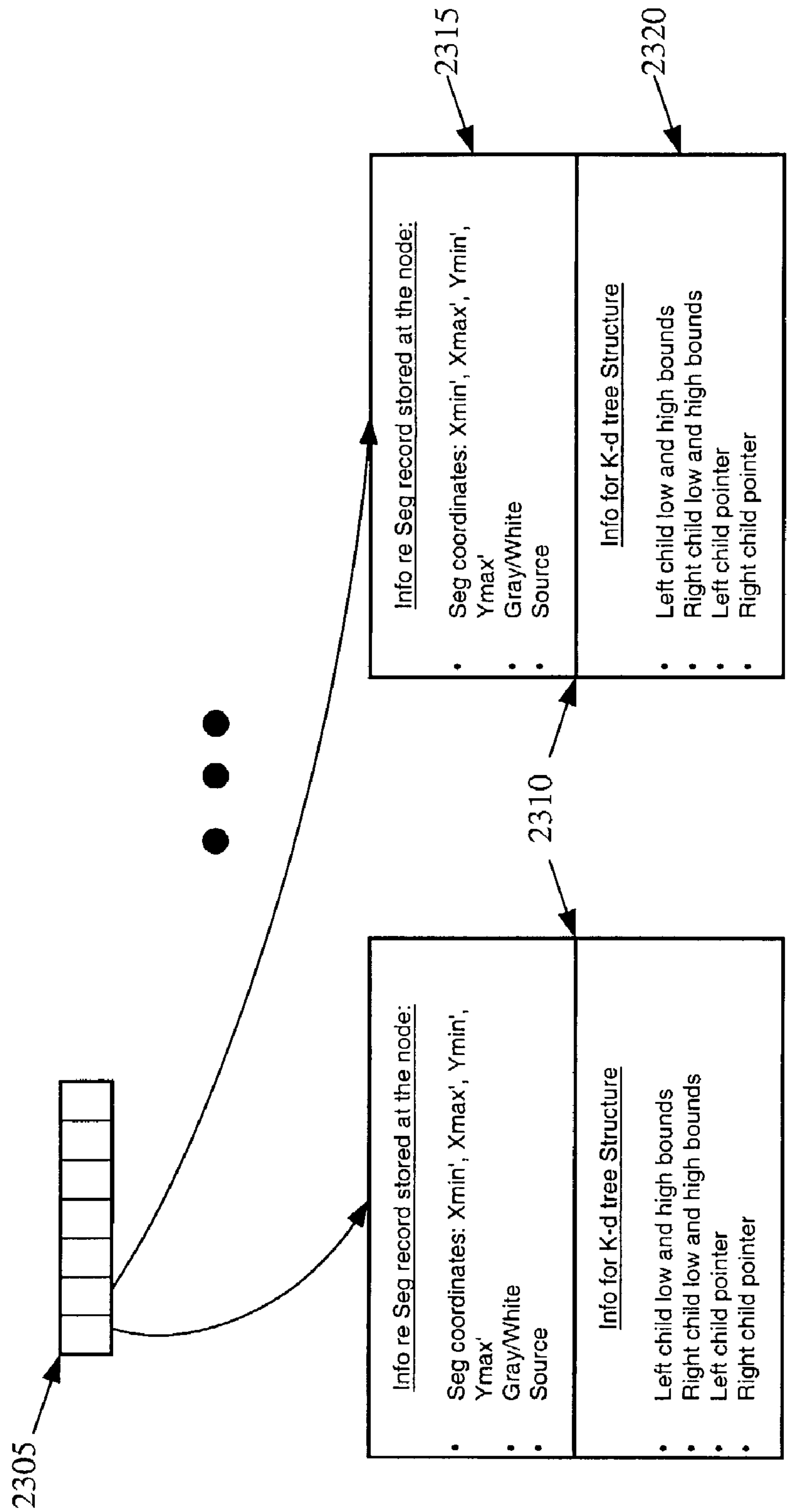
FIG. 23 illustrates one manner for constructing a k-d node array.

FIG. 22 illustrates a more specific process 2200 for converting each inserted seg into a node. This process is performed for all tiles that have at least one inserted segment. Initially, the process (at 2205) allocates a k-d node array. FIG. 23 illustrates one manner for constructing a k-d node array. As shown in FIG. 23, some embodiments create a k-d node array by creating a one-dimensional pointer array 2305 and a k-d node 2310 for each pointer in the array. Each pointer in the array points to a unique k-d node. Some embodiments create the k-d node array by only creating the one-dimensional pointer array 2305. These embodiments create the k-d nodes for this array at step 2215 of process 2200 described below.

In some embodiments of the invention, each k-d node is a k-d node object (i.e., an instantiation of a k-d node class). FIG. 23 illustrates the data structure for a k-d node. As shown in this figure, each k-d node has two sets of fields. The first set 2315 include fields that are to contain data regarding the segment inserted into the node. This data includes the segment's minimum and maximum coordinates, its source or non-source status, and its critical or non-critical status.

The second set of fields 2320 includes fields that are necessary for building and traversing the k-d tree. For instance, it includes left and right child pointers for pointing to the left and right children of the node. These pointers are initialized as NIL pointers. This second set also includes the children nodes' low and high dimension values along the node's discriminator dimension. As described below, the node's discriminator dimension depends on the node's level in the tree, and hence is determined when the tree is being built. The low and high dimension values speed up the process for traversing the tree.

After allocating the k-d node array, the process (at 2210) sets the seg number S and node number N to 1. Next, the process (at 2215) copies segment S's data (i.e., its coordinates and its critical and source status) into the first set of fields 2315 of node N. The process (at 2220) increments the seg number S and node number N by 1.

Next, the process (at 2225) determines whether all the segments have been examined by comparing the segment number S with the maximum segment number. If not, the process repeats steps 2215 and 2220 for the next segment and node. Otherwise, the process (at 2230) determines whether there is only one node in the array. If so, the process (at 2235) connects the root node pointer 925 of the tile data structure 910 to the single node in the array. If not, the process (at 2240) calls a recursive function BuildOptimalKdtree to build a balanced k-d tree.

Figure 24:
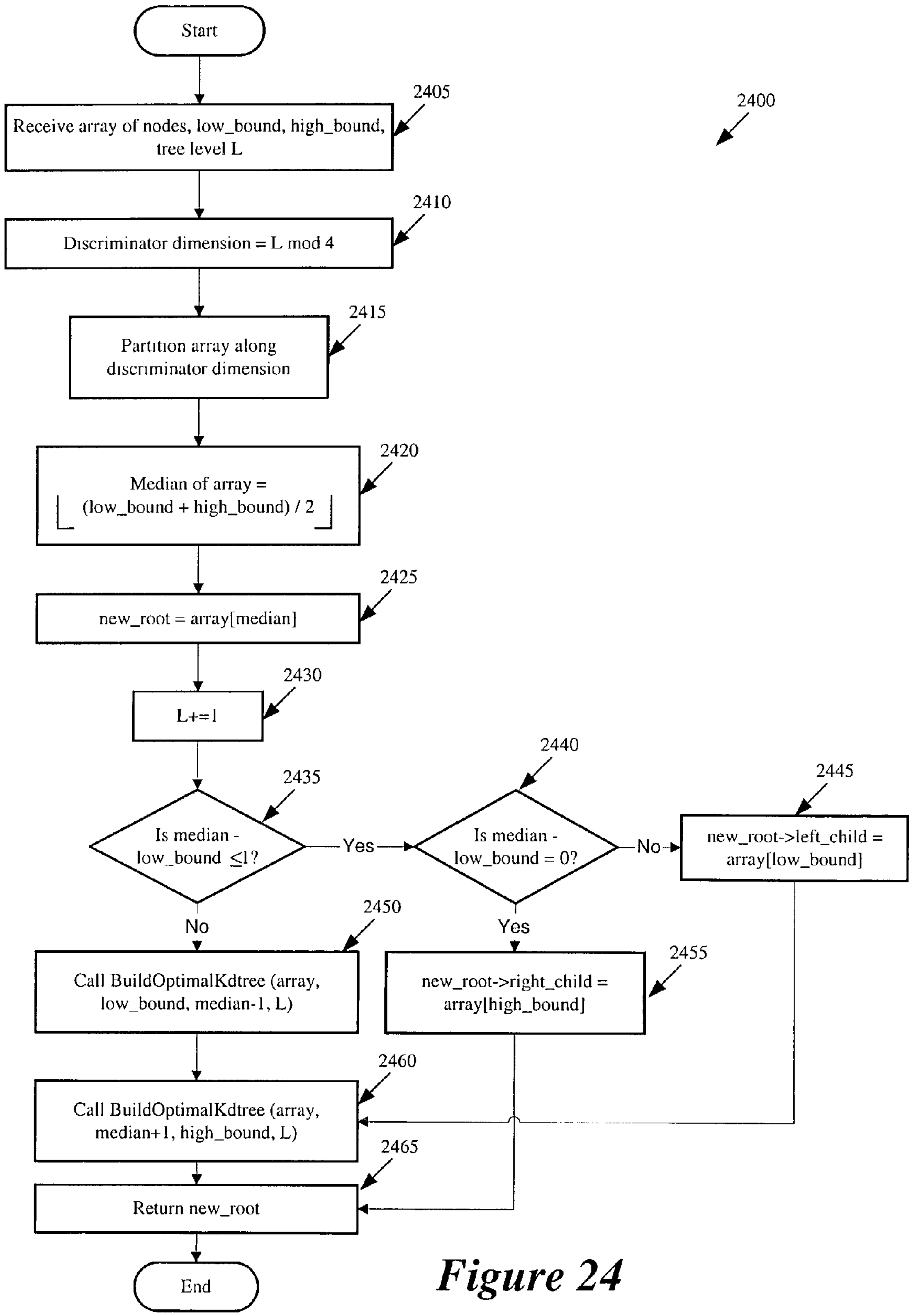
FIG. 24 illustrates a process for building a balanced k-d tree.

FIG. 24 illustrates a process 2400 performed by this recursive function. As shown in this figure, the process (at 2405) receives the k-d node array 2305, plus the low and high bound indices into this array. This process also receives the current level of the tree. Next, the process (at 2410) uses the level of the tree to calculate the discriminator's dimension for the current level L. Specifically, the discriminator key cycles through the four dimensions as the tree expands from the root node. These four dimensions are: minimum x-coordinate ($X_{MIN}$), the minimum y-coordinate ($Y_{MIN}$), width along the x-coordinate ($\Delta X$), and height along the y-coordinate ($\Delta Y$). Hence, the process (at 2410) determines the discriminator's dimension by performing an L-mod-4 operation. Each of the resulting four outputs of this operation is mapped to one of the four dimensions mentioned above.

The process (at 2415) then partitions the array along the calculated discriminator dimension. Specifically, the process determines the median for the array along the calculated discriminator dimension. It then positions all entries in the array whose data values (along the calculated dimension) are less than the median's value to the left of the median, and all entries in the array whose data values (along the calculated dimension) are greater or equal to the median's value to the right of the array. The process can use a variety of partitioning algorithms to perform this operation. For instance, some embodiments of the invention use a partitioning algorithm that is disclosed in Robert Sedgewick, *Algorithms in C++, Third Edition, Parts* 1–4, Addison-Wesley Publishing, 1998, Chapter 7, and in Cormen, et al., *Introduction to Algorithms,* Section 8, 1996.

After partitioning the array along the calculated discriminator dimension, the process (at 2420) determines the median of the array along this dimension by (1) calculating an average of the low-bound and high-bound indices into the array, and (2) rounding this average down to the next layer. Next, the process (at 2425) specifies the node at the median of the array as the new_root node. This new_root node is the root node for the entire k-d tree during the first pass through the BuildOptimalKDtree. In the subsequent recursions, this new_root node defines the parent nodes of left and right subtrees of the k-d tree.

Once the median of the array has been specified as the new_root node, the process passes over the entries on the left and right side of the median in the array in order to figure out the low and high bounds of the left and right children of the new_root node. The process (at 2430) then increments the level of the tree by one. Next, the process (at 2435) determines whether the difference between the median and low-bound indices is less or equal to 1. This would be the case when the array has two or four nodes remaining. If the difference is not less or equal to 1, the process recursively calls itself (at 2450) to build the left subtree for the new_root node, and then recursively calls itself (at 2460) to build the right subtree for the new_root node.

On the other hand, if the difference between the median and the low-bound indices is less or equal to 1, the process (at 2440) determines whether this difference is equal to zero. This would be the case when only two nodes are in the array. In this case, the median is equal to the low-bound index, and hence the root node that the median specified is the node at the low-bound index into the array. Thus, for this case, the process (at 2455) points the new_root's right child to the node at the high-bound index into the array. The process (at 2465) then returns the new_root.

On the other hand, if the difference between the median and the low-bound indices is not equal to zero, four nodes remain in the array and the new_root node corresponds to the second node in the array. In this situation, the first node in the array should be inserted as the new_root node's left child node, and the third and fourth nodes in the array should be sorted (along the next discriminator dimension) to determine which one of them is the right child node of the new_root node.

Figure 25:
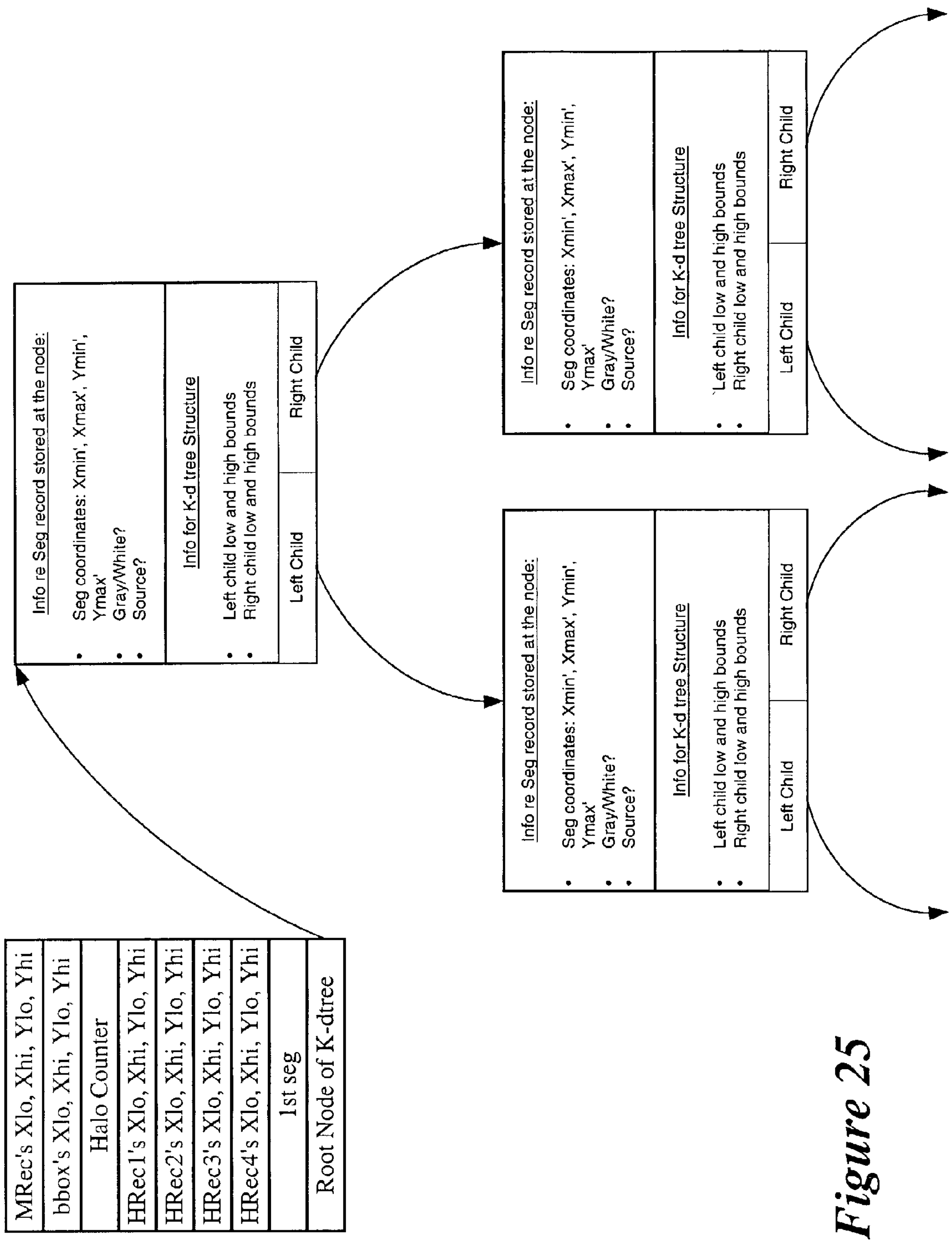
FIG. 25 illustrates a tile data structure with its associated k-d tree.

Hence, if the process (at 2440) determines that the difference between the median and the low-bound indices is not equal to zero, then the process links the new_root node's left child pointer to the node identified by the low-bound index into the array. Next, the process (at 2460) recursively calls itself to build the right subtree for the new_root node. After this recursive call returns a new_root node for the right subtree, the process (at 2465) returns the new_root for the parent of the right subtree. FIG. 25 presents a tile data structure with its associated k-d tree. This figure illustrates how the tile data structure identifies the root of the k-d node, and how the root k-d node connects to its child nodes through its left and right child pointers.

Figure 1:
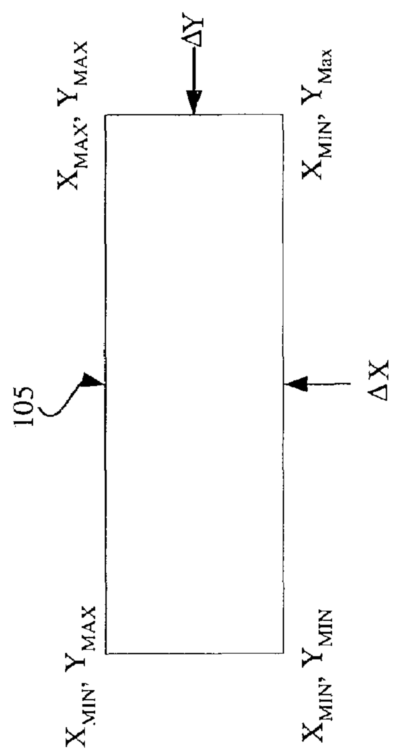
FIG. 1 illustrates a rectangular characterization of an interconnect line.
Figure 2:
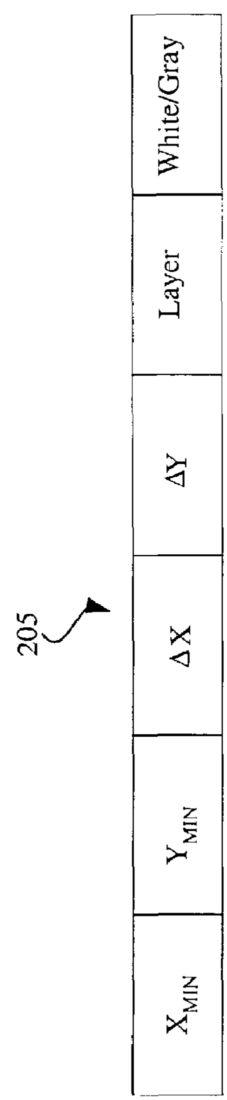
FIG. 2 illustrates a spatial data record that represents the rectangular interconnect line presented in FIG. 1.
Figure 3:
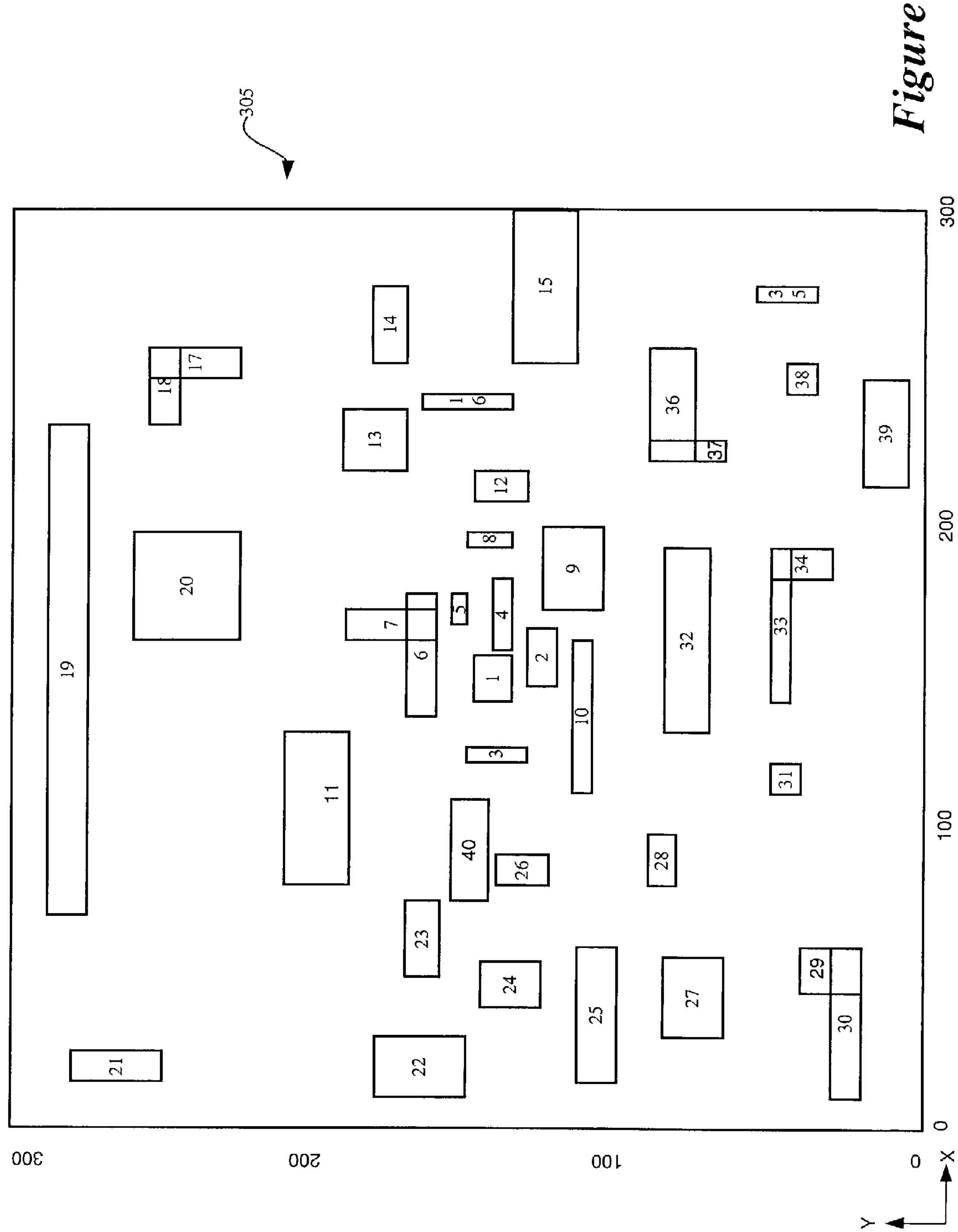
FIG. 3 illustrates a layout of a number of interconnect lines on an IC.
Figure 4:
FIG. 4 illustrates one manner for partitioning the data space presented in FIG. 3.
Figure 5:
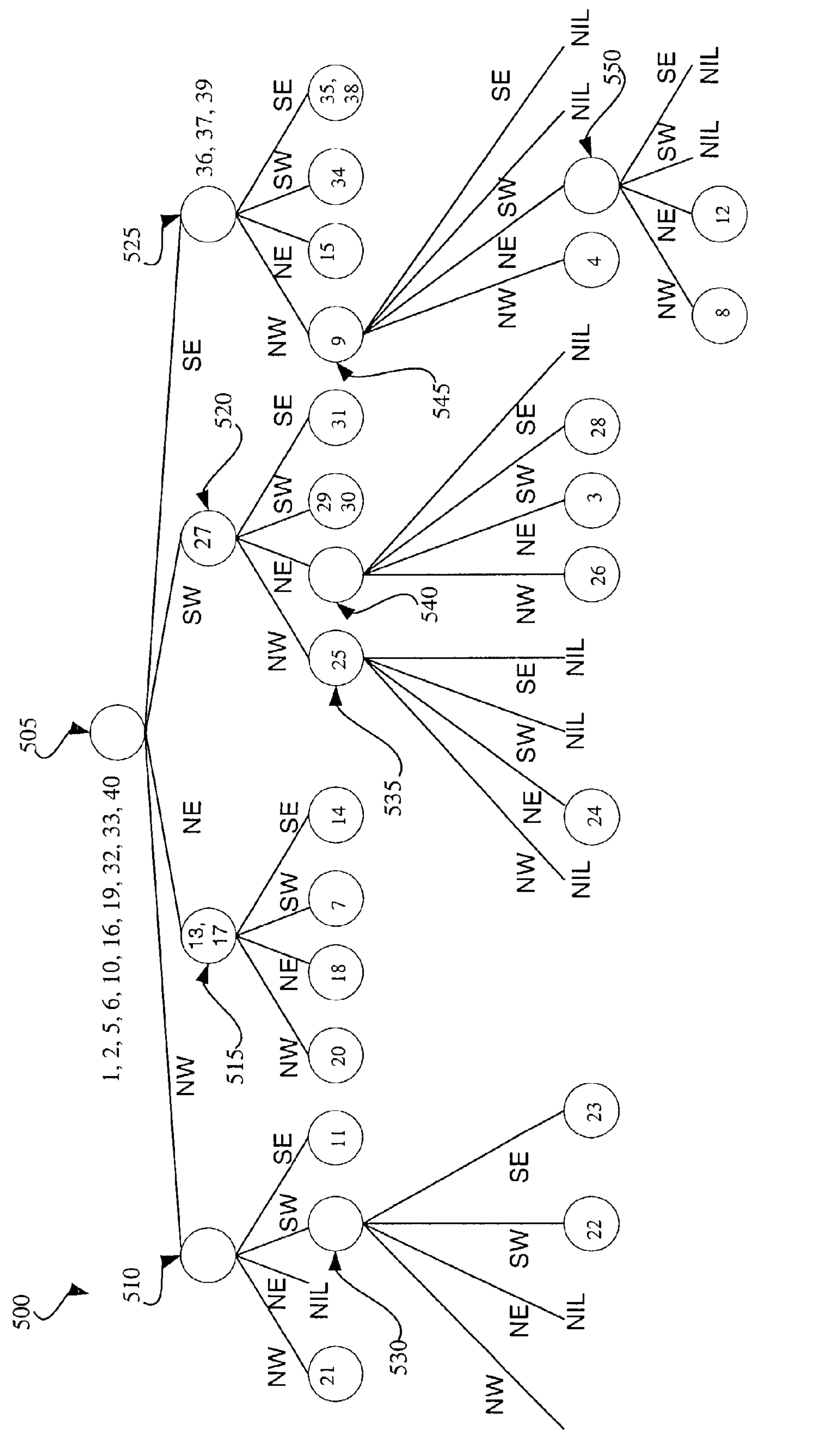
FIG. 5 illustrates the quadtree resulting from the subdivision of the data space presented in FIG. 4.
Figure 6:
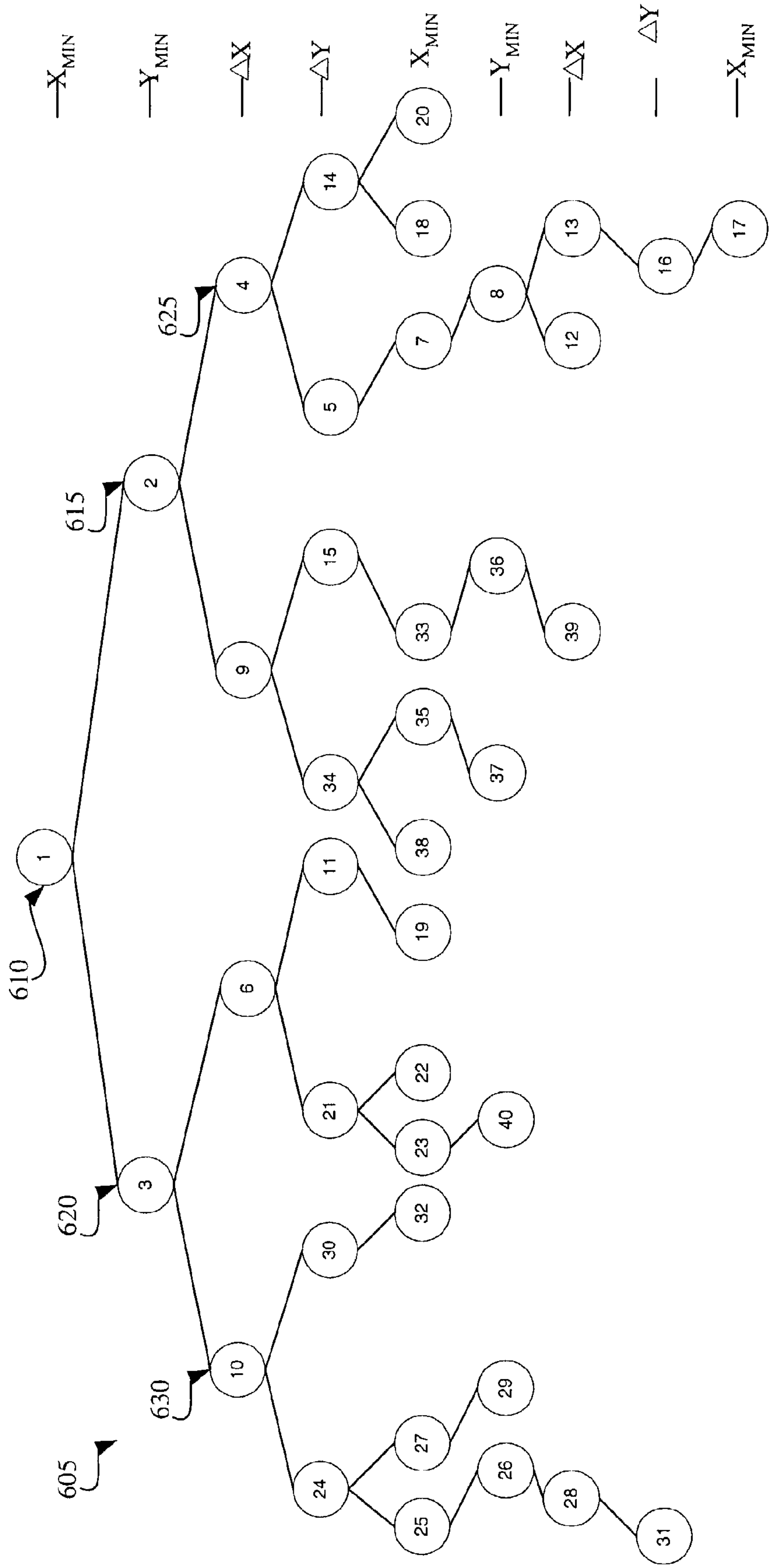
FIG. 6 illustrates a simple k-d tree structure for the rectangles in the layout of FIG. 3.
Figure 26:
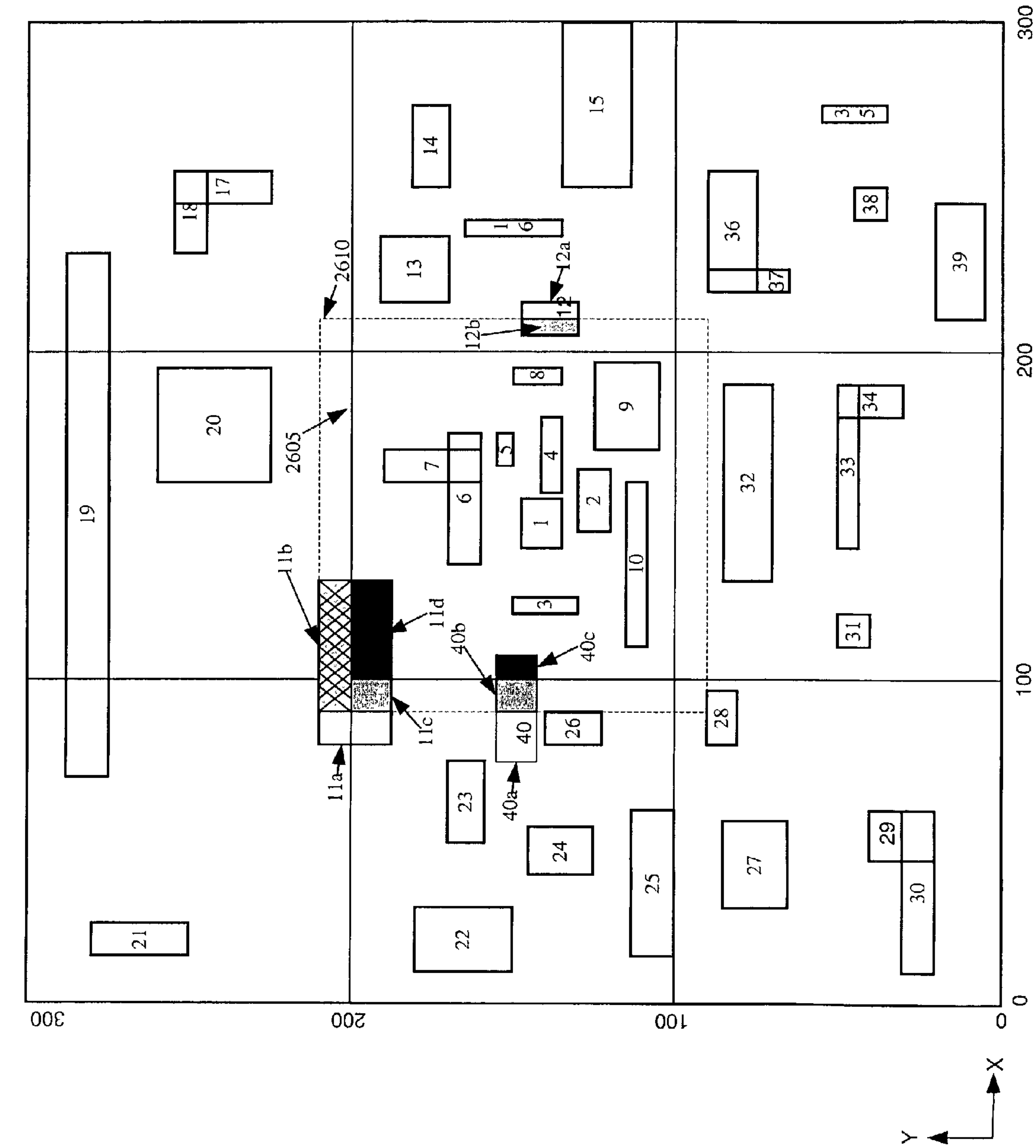
FIG. 26 illustrates one manner of partitioning the IC layout of FIG. 3.

One example of building a k-d tree according to the process 2400 will now be explained by reference to FIGS. 26 and 27. FIG. 26 illustrates one manner of partitioning the IC layout 305 of FIG. 3. In this figure, the IC layout 305 is partitioned along the x- and y-axes into nine square tiles. The layout is divided into these square tiles by two row lines defined by y-dimension values 100 and 200, and two column lines defined by x-dimension values 100 and 200.

Figure 27:
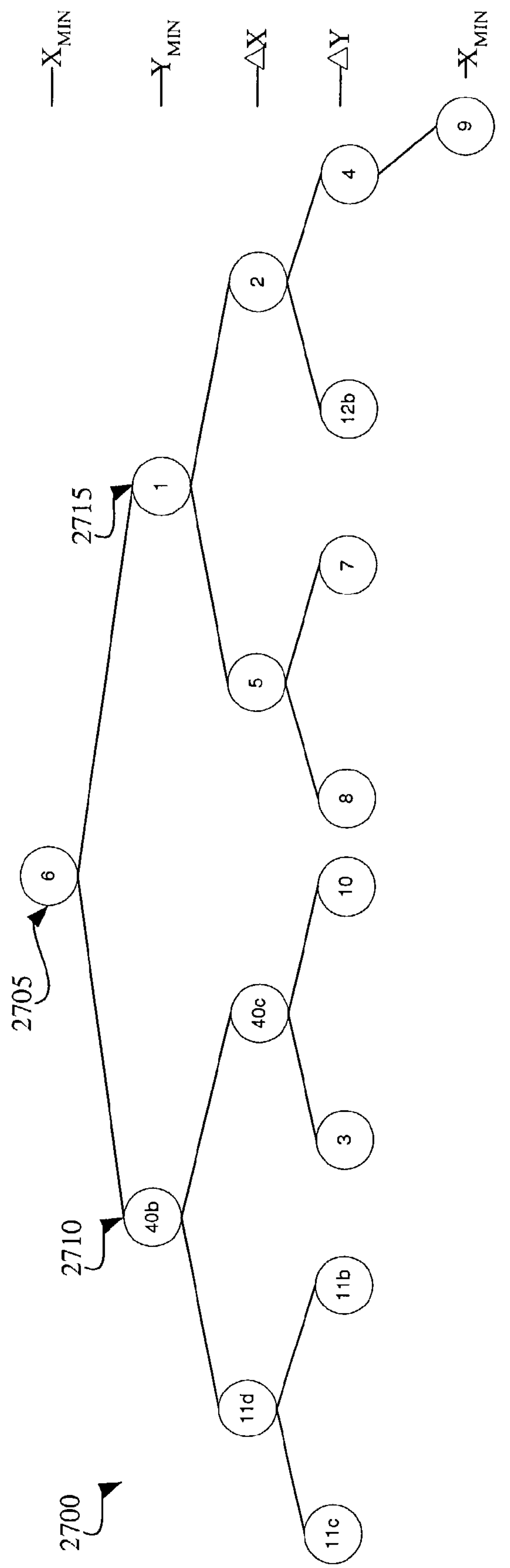
FIG. 27 illustrates a k-d tree that is created by using the process illustrated in FIG. 24.

FIG. 27 illustrates a k-d tree 2700 for a central tile 2605 in FIG. 26. The central tile 2605 has sixteen segs associated with it. Tile 2605 completely encompasses ten of these segs (i.e., segs 1–10). These ten segs are inserted as source segs into the data structure of tile 2605.

Three other segs (i.e., segs 11, 12, and 40) fall partially within the tile's halo boundary 2610, which is 10 units from each side of the tile. Two of these segs (i.e., segs 11 and 40) also fall partially within the tile 2605. As described above by reference to FIG. 18, some embodiments of the invention break interconnect segments into one or more pieces along the tile boundaries that they cross. Hence, in these embodiments, segs 11, 12, and 40 are broken into smaller pieces, with the pieces that are outside the tile's bounding box discarded, while the pieces within the tile's bounding box inserted into the tile data structure as source or non-source segs.

More specifically, like seg 1840 of FIG. 18, seg 11 is broken into four parts, which are labeled as 11*a*, 11*b*, 11*c*, and 11*d* in FIG. 26. Part 11*a* is discarded as it falls outside the tile's bounding box, parts 11*b* and 11*c* are inserted into the tile's data structure as non-source segs, and part 11*d* is inserted into the tile's data structure as a source seg.

Like seg 1830 of FIG. 18, seg 12 is broken into two parts, which are labeled as 12*a* and 12*b* in FIG. 26. Part 12*a* is discarded as it falls outside the tile's bounding box, while part 12*b* is inserted into the tile's data structure as a non-source seg. In addition, like seg 1815 of FIG. 18, seg 40 is divided into three parts, which are labeled as 40*a*, 40*b*, and 40*c*. Part 40*a* is discarded as it falls outside the tile's bounding box, part 40*b* is inserted into the tile's data structure as a non-source seg, and part 40*c* is inserted into the tile's data structure as a source seg.

Table 2 lists the data values for the sixteen segs that are inserted into the data structure of tile 2605.

TABLE 2

| Object | $X_{MIN}$ | ΔX | $Y_{MIN}$ | ΔY |
|---|---|---|---|---|
| 1 | 140 | 15 | 152.5 | 12.5 |
| 2 | 145 | 17.5 | 170 | 10 |
| 3 | 120 | 5 | 150 | 20 |
| 4 | 157.5 | 22.5 | 157.5 | 17.5 |
| 5 | 165 | 10 | 145 | 7.5 |
| 6 | 135 | 40 | 130 | 10 |
| 7 | 160 | 10 | 110 | 30 |
| 8 | 190 | 5 | 150 | 15 |
| 9 | 170 | 27.5 | 175 | 20 |
| 10 | 110 | 50 | 185 | 7.5 |
| 11b | 90 | 40 | 90 | 10 |
| 11c | 90 | 10 | 100 | 12.5 |
| 11d | 100 | 30 | 100 | 12.5 |
| 12b | 205 | 5 | 152.5 | 17.5 |
| 40b | 90 | 10 | 142.5 | 12.5 |
| 40c | 100 | 7.5 | 142.5 | 12.5 |

FIG. 27 illustrates the k-d tree 2700 that stores the data for the sixteen segs associated with the tile 2605. As shown in this figure, this tree has sixteen nodes, and each node contains the data for a separate seg. The discriminator key at each node depends on the level of the node in the tree. Specifically, as the tree expands from the root node, the discriminator key cycles through the following four dimensions: the minimum x-coordinate ($X_{MIN}$), the minimum y-coordinate ($Y_{MIN}$), the width along the x-coordinate (ΔX), and the height along the y-coordinate (ΔY).

As shown in FIG. 27, the discriminator key is the minimum x-coordinate ($X_{MIN}$) at the root node. To identify the seg for the root node, the process 2400 identifies the median $X_{MIN}$ value of the seventeen segs. Seg 6 offers this median value of 135. Thus, this seg is inserted into the root node 2705. The $X_{MIN}$ values of segs 3, 10, 11*b–d*, and 40*b–c* are less than the median value, while the $X_{MIN}$ values of segs 1, 2, 4, 5, 7, 8, 9, and 12*b* are greater than the median value. Hence, segs 3, 10, 11*b–d*, and 40*b–c* belong to the root node's left subtree, while segs 1, 2, 4, 5, 7, 8, 9, and 12*b* are added to the root node's right subtree.

At the second level of the tree, the discriminator key is the minimum y-coordinate ($Y_{MIN}$). Hence, to identify the segs for the left and right child nodes 2710 and 2715 of FIG. 27, the median $Y_{MIN}$ values for the left and right subtrees are computed. The median $Y_{MIN}$ value for the left subtree is the $Y_{MIN}$ of seg 40*b*. The $Y_{MIN}$ values of segs 11*b–d* are less than this median value, while the $Y_{MIN}$ of segs 3, 10, and 40*c* are greater than or equal to this median value. Consequently, the data for seg 40*b* is inserted into the root node's left child node 2710, segs 11*b–d* are added to this child's left subtree, and segs 3, 10, and 40*c* are added to this child's right subtree.

The median $Y_{MIN}$ value for the right subtree of the root node is the $Y_{MIN}$ of seg 1. The $Y_{MIN}$ values of segs 5, 7, and 8 are less than this median value, while the $Y_{MIN}$ of segs 2, 4, 9, and 12*b* are greater than or equal to this median value. Consequently, the data for seg 1 is inserted into the root node's right child node 2715, segs 5, 7, and 8 are added to this child's left subtree, and segs 2, 4, 9, and 12*b* are added to this child's right subtree. The data insertion process continues in a similar fashion until all the records in Table 2 are inserted in the k-d tree. This process results in a balanced k-d tree. Some embodiments of the invention store the constructed k-d trees in the permanent storage device 825 of the computer system 800.

F. Range Queries

EDA applications can use the two-layered data structure 900 to speed up capacitance extraction operations. In particular, EDA applications can use this two-layered data structure to identify quickly interconnect lines with a certain distance (i.e., a halo distance) of critical interconnect lines. These identified interconnect lines can then be used to compute the capacitances exerted on the critical interconnect lines.

Figure 28:
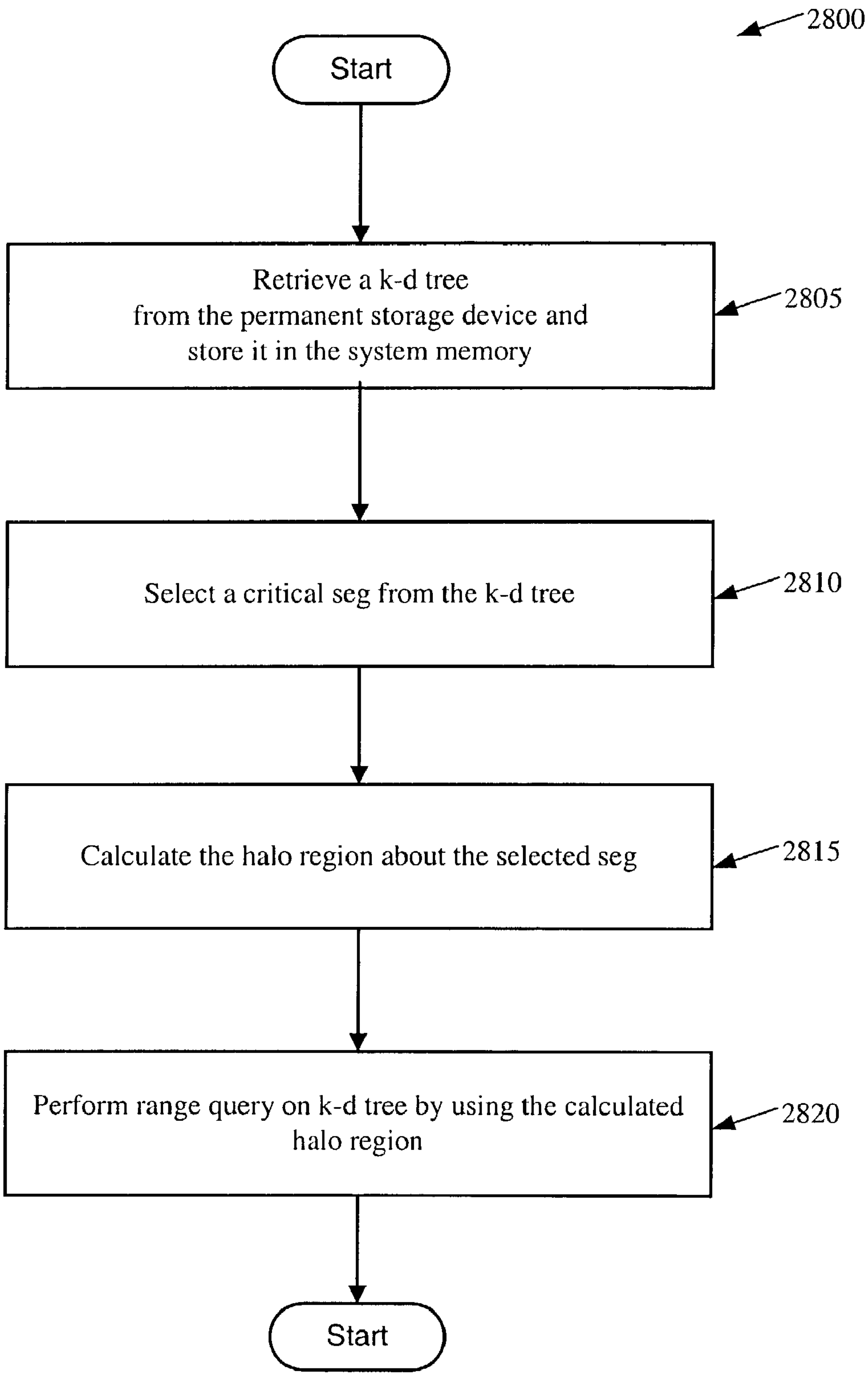
FIG. 28 illustrates a process for identifying interconnect lines that are within a halo distance of a critical interconnect line.

FIG. 28 illustrates one process that is used in some embodiments of the invention to identify the interconnect lines within a halo distance of a critical interconnect line. This process (at 2805) initially retrieves a k-d tree from the permanent storage device 825, and stores this k-d tree in the system memory 815 of the computer system 800. Next, the process (at 2810) selects a critical interconnect seg in the retrieved k-d tree.

The process (at 2815) then calculates the halo region surrounding the selected seg. In some embodiments of the invention, this halo region is defined as a rectangle that has its centered aligned with the seg's center, and has its vertical and horizontal sides a halo distance d away from the seg's vertical and horizontal sides respectively.

Next, the process (at 2820) uses the calculated halo region as a range-query window to perform a range query on the k-d tree of the selected seg. In some embodiments of the invention, the process 2800 uses known techniques for traversing the tree and performing a range query on a k-d tree. For instance, the process makes branching decisions at each node by determining whether that node's discriminator value falls below, above, or within the query range along that node's discriminator dimension. The process needs to examine (1) the node's left subtree when the node's discriminator value is greater than the query range, (2) the node's right subtree when the node's discriminator value is less than the query range, and (3) the node's left and right subtrees when the node's discriminator value falls within the query range.

As discussed above by reference to FIG. 23, each node in the k-d tree specifies the low and high dimension values (along the node's discriminator dimension) of the nodes in its left and right subtree. Consequently, the process 2800 can use these low and high dimension values at each node to determine whether it would be useful to examine the subtrees originating from a node. For instance, if a node's discriminator value is greater than the query range, the process can examine the low bound of the node's left subtree to determine whether the lowest value in that subtree is also above the query range along that node's discriminator. If so, the process does not need to examine the left subtree since all the segs in this subtree are above the query range along that node's discriminator.

Each time the process 2800 encounters a node whose discriminator value falls within the query range, the process determines whether the remaining coordinates of the seg stored at that node fall within its range query window. In essence, the process compares the coordinates of the seg stored at that node with the coordinates of its range-query window. If the seg falls within this range-query window, the process returns this seg's data.

Some embodiments of the invention perform process 2800 for all critical (i.e., white) source segs in all the k-d trees. In fact, some embodiments sequentially perform this process for all critical source segs in a retrieved k-d tree, before retrieving another k-d tree to analyze its segs.

One of ordinary skill in the art will understand that the invention's two-layer data structure 900 has numerous advantages. For instance, as discussed above, it speeds up the capacitance extraction operation, because it allows an EDA application to identify quickly all interconnect lines near a particular critical line by simply analyzing one small k-d tree. Only one small k-d tree needs to be examined for each critical seg, since each seg is stored in a small k-d tree with all the interconnect lines that might capacitively couple to it.

Dividing the IC layout into smaller regions, and creating relatively smaller k-d trees to store the seg data in each region, also allows the total query runtime to increase linearly with the number of interconnect segs in the layout. The runtime for performing N queries for N segs in a k-d tree is proportional to $N\log_2 N$. However, if the IC layout is divided into two regions and each region roughly contains N/2 segs, the time for performing range queries about all the segs in each region is proportional to $\frac{1}{2}N\log_2(N/2)$. Thus, the time for performing a range query about the segs in both regions is proportional to $N\log_2(N/2)$, which is better than $N\log_2(N)$.

Similarly, if the IC layout is divided into R regions with each region containing roughly N/R segs, the time for performing a range query about all the segs in all the regions is proportional to $N\log_2(N/R)$. Equation (1) below explains this mathematically.

$$\text{Total run time} \propto \sum_R \frac{N}{R}\log_2\frac{N}{R} = N\,\log_2\frac{N}{R} << N\,\log_2 N \tag{1}$$

Hence, dividing the IC layout into smaller regions, and creating relatively smaller k-d trees to store the data in each region, reduce the total query time. This reduction can be significant if the number of data regions R is on the same order as the number of segs N. In fact, the total query time can be made to increase only linearly with the number of segs, by increasing the number of data regions R linearly with the number of segs N. For example, if the number of regions R is selected so that it is always equal to N/1000, then the total query time will always be proportional $N\log_2(1000)$.

The data structure 900 also works well with computers that have smaller system memories. This data structure does not need as much system memory because (1) an EDA application will only need to examine one tile's k-d tree for each critical seg, and (2) each tile's k-d tree is much smaller than a traditional k-d tree that stores the data for all the segs in the IC layout.

While the invention has been described with reference to numerous specific details, one of ordinary skill in the art will recognize that the invention can be embodied in other specific forms without departing from the spirit of the invention. For instance, even though the embodiments described above have only one k-d tree for each tile, some embodiments of the invention have more than one k-d tree for each tile. For each tile, some embodiments have one k-d tree for white segs (i.e., critical segs) and one k-d tree for gray segs (i.e., non-critical segs).

Also, FIGS. 12, 13, and 26 above present uniform sized and shaped tiles that divide the IC layouts. In other embodiments, different tile sizes and shapes are used to divide the same IC layout. Thus, one of ordinary skill in the art would understand that the invention is not to be limited by the foregoing illustrative details, but rather is to be defined by the appended claims.

We claim:

1. A computer-implemented method of representing multidimensional data tuples, the method comprising:

a) defining a plurality of data regions in a multidimensional data space;

b) creating a plurality of hierarchical data structures for a plurality of said data regions, wherein each hierarchical data structure corresponds to a particular data region and stores the multidimensional data tuples within said particular data region, wherein each multidimensional data tuple includes a plurality of values, said values specified along a plurality of dimensions wherein the multidimensional data tuples are spatial data that represent spatial data objects; and c) storing the created hierarchical data structures in a first memory of a computer system.

2. The method of claim 1 further comprising:

a) retrieving a hierarchical data structure of a data region from the first memory;

b) storing the retrieved hierarchical data structure in a second memory of the computer system; and c) performing a query on the hierarchical data structure stored in the second memory.

3. The method of claim 2, wherein the first memory is a permanent storage device and the second memory is a system memory of the computer system.

4. The method of claim 1, wherein a hierarchical data structure is created for each data region.

5. The method of claim 1, wherein hierarchical data structures are created only for some data regions.

6. The method of claim 5, wherein hierarchical data structures are created for all data regions that contain multidimensional data tuples.

7. The method of claim 1 further comprising creating a non-hierarchical data structure to represent the division of the data space into a plurality of data regions.

8. The method of claim 7, wherein creating the non-hierarchical data structure includes creating an array of data objects, wherein each particular data object represents one particular data region.

9. The method of claim 1 further comprising adaptively determining the number or size of the data regions in the multidimensional data space based on the number of multidimensional data tuples in the multidimensional space.

10. The method of claim 1, wherein the hierarchical data structures are k-d trees.

11. The method of claim 1, wherein the hierarchical data structures are quadtrees.

12. The method of claim 1, wherein said multidimensional data tuples are stored on a computer readable medium, the method further comprising:

a) retrieving the multidimensional data tuples from the computer readable medium; and b) inserting each retrieved multidimensional data tuple into a hierarchical data structure of a region that the multidimensional data tuple intersects.

13. The method of claim 1, wherein the spatial data objects represent interconnect lines in a design layout of an integrated circuit.

14. For a computer system that represents spatial objects by using spatial data tuples, a method of storing spatial data tuples defined in a multidimensional coordinate system, the method comprising:

a) defining a plurality of regions in the multidimensional coordinate system; and b) creating a plurality of hierarchical data structures for a plurality of said regions, wherein each hierarchical data structure corresponds to a particular region and stores the spatial data tuples of the spatial objects within said particular region, wherein each spatial data tuple includes a plurality of spatial attributes that are defined in the multidimensional coordinate system wherein the spatial objects are geometric objects.

15. The method of claim 14, further comprising:

for each particular region that has a hierarchical data structure, a) identifying the spatial objects that are outside of the particular region that are needed for the analysis of the spatial objects within the particular region; and b) inserting the spatial data tuples of the identified spatial objects into the hierarchical data structure for the particular region.

16. The method of claim 14, wherein a particular spatial object crosses a boundary between a first region and a second region, wherein a first portion of the spatial object is in the first region, the method further comprising:

a) defining a first spatial data tuple to represent the first portion; and b) inserting the first spatial data tuple into the hierarchical data structure of the first region.

17. The method of claim 14, further comprising creating a non-hierarchical data structure to represent the plurality of regions, wherein the non-hierarchical data structure includes a plurality of entries and each particular entry represents a particular region.

18. The method of claim 17, wherein creating the non-hierarchical data structure includes creating an array of data objects, wherein each particular data object represents one particular region.

19. The method of claim 14, further comprising adaptively determining the number of regions.

20. The method of claim 19, wherein adaptively determining the number of regions includes increasing the number of the regions as the number of spatial objects increases.

21. The method of claim 20, wherein the number of the regions increases linearly with the number of spatial objects.

22. The method of claim 14 further comprising adaptively determining the size of the regions.

23. The method of claim 22, wherein adaptively determining the region sizes includes decreasing the size of the data regions as the number of spatial objects increases.

24. The method of claim 22, wherein adaptively determining the region sizes includes:

a) specifying a variety of region sizes;

b) for each region size, computing the total time for performing queries for all spatial data tuples in all the hierarchical data structures; and c) selecting the region size that results in the smallest computed total query time.

25. The method of claim 24, wherein computing the total time comprises:

a) predicting the average number of spatial objects per each region;

b) computing the average time for querying a hierarchical data structure that includes the spatial data tuples for the average number of spatial data objects; and c) computing the total time by multiplying the average time by the number of regions resulting from the region size.

26. The method of claim 14, wherein the hierarchical data structures are k-d trees.

27. The method of claim 14, wherein the hierarchical data structures are quadtrees.

28. The method of claim 15, wherein the geometric objects represent interconnect lines in an integrated circuit design layout.

29. A computer readable medium having a set of instructions stored therein for enabling a computer to store spatial data tuples defined in a multidimensional coordinate system, wherein the spatial data tuples are the computer decipherable representation of spatial objects, said set of instructions including:

a) a first set of instructions, which when executed by the computer cause the computer to define a plurality of regions in the multidimensional coordinate system; and b) a second set of instructions, which when executed by the computer cause the computer to create a plurality of hierarchical data structures for a plurality of said regions, wherein each hierarchical data structure corresponds to a particular region and stores the spatial data tuples of the spatial objects within said particular region, wherein each spatial data tuple includes a plurality of spatial attributes that are defined in the multidimensional coordinate system wherein the spatial objects are geometric objects.

30. The computer readable medium of claim 29 further comprising:

a third set of instructions, which when executed by the computer, for each particular region that has a hierarchical data structure, cause the computer to (i) identify the spatial objects that are outside of the particular region that are needed for the analysis of the spatial objects within the particular region, and (ii) insert the spatial data tuples of the identified spatial objects into the hierarchical data structure for the particular region.

31. The computer readable medium of claim 29, wherein a particular spatial object crosses a boundary between a first region and a second region, wherein a first portion of the spatial object is in the first region, the computer readable medium further comprising:

a) a third set of instructions, which when executed by the computer cause the computer to define a first spatial data tuple to represent the first portion; and b) a fourth set of instructions, which when executed by the computer cause the computer to insert the first spatial data tuple into the hierarchical data structure of the first region.

32. The computer readable medium of claim 29 further comprising a third set of instructions, which when executed by the computer cause the computer to create a non-hierarchical data structure to represent the plurality of regions, wherein the non-hierarchical data structure includes a plurality of entries and each particular entry represents a particular region.

33. The computer readable medium of claim 29 further comprising a third set of instructions, which when executed by the computer cause the computer to adaptively determine the number of regions.

34. A computer readable medium having a set of instructions stored therein for enabling a computer to store multidimensional data tuples defined in a multidimensional data space, said set of instructions including:

a) a first set of instructions, which when executed by the computer cause the computer to define a plurality of data regions in the multidimensional data space; and b) a second set of instructions, which when executed by the computer cause the computer to create a plurality of hierarchical data structures for a plurality of said data regions, wherein each hierarchical data structure corresponds to a particular data region and stores the multidimensional data tuples that are within said particular data region, wherein each multidimensional data tuple includes a plurality of values, said values specified along a plurality of dimensions wherein the multidimensional data tuples are spatial data that represent spatial data objects.

35. An apparatus for storing multidimensional data tuples defined in a multidimensional data space, said apparatus comprising:

a) a means for defining a plurality of data regions in the multidimensional data space; and b) a means for creating a plurality of hierarchical data structures for a plurality of said data regions, wherein each hierarchical data structure corresponds to a particular data region and stores the multidimensional data tuples that are within said particular data region, wherein each multidimensional data tuple includes a plurality of values, said values specified along a plurality of dimensions wherein the multidimensional data tuples are spatial data that represent spatial data objects.

36. An apparatus for storing spatial data tuples defined in a multidimensional coordinate system, wherein the spatial data tuples are the computer decipherable representation of spatial objects, said apparatus comprising:

a) a means for defining a plurality of regions in the multidimensional coordinate system; and b) a means for creating a plurality of hierarchical data structures for a plurality of said regions, wherein each hierarchical data structure corresponds to a particular region and stores the spatial data tuples of the spatial objects within said particular region, wherein each spatial data tuple includes a plurality of spatial attributes that are defined in the multidimensional coordinate system wherein the spatial objects are geometric objects.

* * * * *